(12) United States Patent
Tawa et al.

(10) Patent No.: US 6,950,598 B1
(45) Date of Patent: Sep. 27, 2005

(54) LIGHT EMITTING HEAD, INFORMATION STORAGE DEVICE, AND COMPOSITE HEAD MANUFACTURING METHOD

(75) Inventors: Fumihiro Tawa, Kawasaki (JP); Shin-ya Hasegawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/015,141

(22) Filed: Dec. 17, 2004

(30) Foreign Application Priority Data

Sep. 2, 2004 (JP) .............................. 2004-255732

(51) Int. Cl.⁷ ............................ G02B 6/122; G02B 6/26
(52) U.S. Cl. ........................ 385/146; 385/31; 385/131
(58) Field of Search ............................ 385/15, 31, 36, 385/39, 131, 146, 147, 901

(56) References Cited

U.S. PATENT DOCUMENTS

| | | | | |
|---|---|---|---|---|
| 4,382,656 A | * | 5/1983 | Gilby .......................... | 385/146 |
| 5,462,700 A | * | 10/1995 | Beeson et al. .............. | 264/1.27 |
| 5,625,738 A | * | 4/1997 | Magarill ..................... | 385/146 |
| 5,657,408 A | * | 8/1997 | Ferm et al. .................. | 385/43 |
| 5,689,480 A | | 11/1997 | Kino .......................... | 369/14 |
| 6,272,267 B1 | * | 8/2001 | Hansler et al. .............. | 385/43 |

FOREIGN PATENT DOCUMENTS

| | | | | |
|---|---|---|---|---|
| JP | 10-206660 | 8/1998 | ............ | G02B 6/10 |
| JP | 2000-215494 | 8/2000 | ........... | G11B 7/135 |
| JP | 2004-030840 | 1/2004 | ............ | G11B 7/12 |
| WO | WO 2004/044907 A1 | 5/2004 | ........... | G11B 7/135 |

OTHER PUBLICATIONS

Matsumoto et al, "Fabrication of a Near-Field Optical Fiber Probe with a Nanometric Metallized Protrusion," Optical Review, vol. 5, No. 6, 1998, pp. 369-373.

Yatsui et al., "Increasing Throughput of a Near-Field Optical Fiber Probe Over 1000 Times by the Use of a Triple-Tapered Structure," Applied Physics Letters, vol., 73, No. 15, Oct. 1998, pp. 2090-2092.

* cited by examiner

Primary Examiner—John D. Lee
(74) Attorney, Agent, or Firm—Greer, Burns & Crain, Ltd.

(57) ABSTRACT

The present invention provides a light emitting head which has high utilization efficiency of light and facilitates alignment with other heads and which facilitates fabrication, information storage device which provides high volume access to information with such a light emitting head, and composite head manufacturing method suitable to fabricate a composite head having such a light emitting head. The light emitting head includes: a first structure section including a first well propagating section consisting of a low extinction material with substantially negligible attenuation of light, a second well propagating section consisting of another low extinction material with substantially negligible attenuation of light, and whose refractive index is larger than that of the first well propagating section, and a poor propagating section consisting of a material with a propagating characteristics poorer than the second well propagating section; and a second structure section concentrating light on the first structure section.

14 Claims, 16 Drawing Sheets

LIGHT EMITTING HEAD, INFORMATION STORAGE DEVICE, AND COMPOSITE HEAD MANUFACTURING METHOD

BACKGROUND OF THE INVENTION

1. Field of the Invention

The present invention relates to a light emitting head that irradiates light, an information storage device that uses the light emitting head to access information on a predetermined recording medium, and a manufacturing method for manufacturing a composite head having the light emitting head.

2. Description of the Related Art

As the information society evolves, the amount of information continues to grow. In response to the increase in the amount of information, there has been a demand for the development of an information recording scheme or an information storage device with a dramatically high recording density.

In optical disk devices that record and reproduce information to and from a recording medium (optical disk) by means of a spot of light, reducing the size of the spot impinging on the recording medium has provided a high density. The spot size concentrated by lenses, however, has recently been approaching a limit because it can theoretically be reduced to as much as the wavelength of the incident light. Therefore, as a recording scheme that enables the spot size to be further reduced to provide further high density recording, attention has been attracted onto a near field optical recording scheme that uses a near field light emanated from a micro aperture smaller than a wavelength of an incident light to form a smaller spot size than the wavelength. This near field optical recording scheme employs, as a light emitting head, a near field optical head that includes such a micro aperture and propagates light to the micro aperture to generate the near field light.

For a micro aperture in a near field optical head, for example, there is known an aperture provided on a tip of a sharpened optical fiber, as described in Japanese Patent Publication No. 10-206660. The aperture is fabricated by coating an optical fiber, which has a tip sharpened by heating and drawing the fiber or using a selective chemical etching with buffered hydrofluoric acid, with a metal film, and removing a part of the coated and sharpened tip using particle beam, such as focused ion beam (FIB) and the like. There are also known techniques that improve propagation efficiency of light or spot size by modifying tip shape of a optical fiber (for example, see Opt. Rev. vol. 5, No. 6 (1998) 369–373 and Appl. Phis. lett., vol. 73, No. 15).

Another technique for fabricating a micro aperture in a near field optical head is disclosed in U.S. Pat. No. 5,689,480, in which a funnel-shaped aperture is created in a planar plate. In this technique, a Si substrate is patterned using lithographic techniques to provide a rectangular pattern on the substrate, then the pattern is subjected to anisotropic etching taking advantage of a crystal orientation of the substrate to create a recess of inverted pyramid shape, and the apex of the inverted pyramid, which represents the deepest point in the substrate, is passed through the back side of the substrate by polishing or etching on the back side of the Si substrate.

Japanese Patent Publication No. 2004-30840 discloses a light emitting head (near field optical head) having a simple shape of two-dimensional geometry which can be produced by lithographic techniques such as using a stepper exposure apparatus. In a technique disclosed in Japanese Patent Publication No. 2004-30840, a transparent dielectric is layered on a substrate, the dielectric is covered with a metal after patterned, and a small aperture is created by cutting an exit portion using FIB and the like to generate near field light.

In conventional near field light recording schemes, however, there is a problem of utilization efficiency of light being several orders of magnitude lower than in a lens optical system. A further problem arises in that metal films are produced to form a micro aperture, and non-negligible leakage light is produced at the border between the aperture and films in addition to a main spot generated in the aperture.

In conventional method of creating a micro aperture, there is also a problem of the variation in the diameter of the created aperture due to errors in a drilled location of a micro aperture, the film thickness of a metal film, and the length of the medium itself which propagates light. Consequently desired propagation efficiency or electromagnetic fields cannot be obtained. In addition, in case of multiple heads for example, there arises a problem regarding a relative location to other heads when processes are repeated on each near field optical head to make the diameter to a desired size; in this case, the distance from a head to a recording medium varies on a head basis due to variation in drilled locations, even when each head has the same diameter. The conventional near field optical head thus suffers from the problems in the fabricating processes.

Moreover, it is conceivable that the near field optical head is not used alone but requires a magnetic head such as those in a magneto-optical (MO) disk device and light assisted magnetic recording/reproducing device. The light assisted magnetic recording/reproducing device is particularly hopeful to provide a recording capacity over 1 Tb. In the light assisted magnetic recording/reproducing device, light emitted from a light emitting head is irradiated onto a magnetic recording medium in writing information so that the temperature of the magnetic recording medium rises and, immediately after that, a magnetic field generated by a recording magnetic head writes the information. A reproducing magnetic head is used to read the information in reading the information. Advantages of the light assisted magnetic recording/reproducing device include the facts that information can be written with low magnetic field intensity in the magnetic recording medium, and a problem of thermal fluctuation can be avoided because records are fixed once the temperature decreases. These devices, however, are required to generate magnetism near the light-irradiating area. It is practically impossible to mount a magnetic head on a near field optical head, which uses fibers and lenses, with an accuracy corresponding to a track pitch of the recording media. Although in the near field optical head disclosed in Japanese Patent Publication No. 2004-30840, a magnetic head can be integrated into it using lithographic techniques, the near field optical head has an aperture diameter of several hundreds nanometers and a light spot is formed in the center of the aperture, causing the light spot to be located away from the magnetic head by a distance at least half of the aperture diameter. Given the fact that the track pitch is about 20 nm for 1 Tb recording density, if a light spot is located away from a magnetic head by 100 nm or more, a problem arises in that light and magnetism are irradiated and generated in a different track when both heads are moved by an arm and the like to incline with respect to the track. Therefore, the conventional near field optical head also has a problem regarding its alignment.

SUMMARY OF THE INVENTION

The present invention has been made in view of the above circumstances and provides a light emitting head which has high utilization efficiency of light and facilitates its alignment with other heads and which facilitates its fabrication, information storage device which provides high volume access to information with such a light emitting head, and composite head manufacturing method suitable to manufacture a composite head having such a light emitting head.

A first light emitting head according to the invention is characterized in that, in a light emitting head which receives light from an incident light origin and propagates and focuses the light to an exiting light destination, it includes:

a first structure section including, a first well propagating section which consists of a first low extinction material with attenuation of light substantially low to a negligible extent, the first well propagating section being located along an optical axis from the incident light origin to the exiting light destination, a second well propagating section which consists of a second low extinction material with attenuation of light substantially low to a negligible extent, and whose refractive index is larger than that of the first well propagating section in a bulk material, a pair of the second well propagating sections sandwiching the first well propagating section therebetween in at least one axis-intersecting direction intersecting the optical axis, and a poor propagating section which consists of a material with any propagating characteristics, which may be non-propagative, poorer than that of the second well propagating section in a bulk material, a pair of the poor propagating sections further sandwiching the first and second well propagating sections therebetween from the outside of the second well propagating section in the axis-intersecting direction; and a second structure section being located on one of two sides sandwiching the first structure section in the axis-intersecting direction, the second structure section concentrating light on the first structure section within the range from the incident light origin to the exiting light destination.

To obtain a micro spot smaller than a wavelength of light, it is effective to use both means for concentrating light in a high refractive index material and means for utilizing a surface propagating wave in which electromagnetic wave propagates on a surface along a border of the materials. For this purpose, it is important how efficiently the surface propagating wave can be produced and concentrated to a required size. The larger the refractive index difference is at a surface, the more efficiently the surface propagating wave is produced. For example, at the border between transparent, a low refractive index material of $SiO_2$ (n=1.48) and a high refractive index material of Si (n=4.380, k=2.02), the surface propagating wave is generated mainly on the side of the low refractive index material. As used herein, a complex index of refraction of a material is expressed as n−j*k, where n is a real part of the refractive index, k is an imaginary part, and j is an imaginary unit.

Materials with a high refractive index such as Si, however, are absorptive because they also have large value of k, which corresponds to an attenuation factor, attenuating the surface propagating wave while propagating. The first light emitting head according to the invention is thus provided with the first structure section in which the second well propagating section consisting of a material of transparent and with an intermediate refractive index (for example, $TiO_2$; n=2.6, ZnS; n=2.4, and the like) exists between the first well propagating section consisting of a transparent, low refractive index material (for example, $SiO_2$; n=1.48, $MgF_2$; n=1.384, and the like) and the poor propagating section consisting of an absorptive, high refractive index material (such as, Si). In this case, the refractive index difference between the first and second well propagating sections is preferably 1.0 or more.

According to a light emitting head having such a first structure section, the propagating wave is generated at the border between the first and second well propagating sections, and small value of k warrants less attenuation. The high refractive index of the poor propagating section adjacent to the second well propagating section increases an effective refractive index of the second well propagating section, thus making the production of the propagating wave more efficient than when only the first and second well propagating sections are used. Furthermore, because the poor propagating section causes the propagating wave to transmit in the direction of film thickness whereas to attenuate in the in-plane direction, local leakage of an electromagnetic wave into other layers like near field light is reduced, thus reducing an intensity of a side lobe in a light spot profile (intensity distribution).

Also according to the first structure section, the light spot profile is dependent on the thickness of the first well propagating section. The reproducibility of the thickness of the first well propagating section may be ensured with angstrom accuracy of a film-forming apparatus, and thus accurate reproduction of the profile is also ensured.

Further, given the fact that the first light emitting head according to the invention is provided with the above second structure section on one side of the first structure section, even when it is required to bring another head such as a magnetic head close to the light-irradiating area with a light emitting head, fabricating another head on the first structure section on the side opposite to the second structure section enables the light-irradiating area to be offset to the side of another head.

In this way, according to the first light emitting head of the invention, utilization efficiency of light may be improved and alignment with other heads is facilitated.

The first light emitting head according to the invention may be in the form;

in which the second structure section has a reflecting surface inclined with respect to the optical axis and reflects light toward the first structure section;

in which the second structure section has a sequential or continuous refractive index distribution in which the refractive index increases toward the first structure section; or in which the second structure section has a layered structure in which a set of multiple kinds of layers varying in refractive index each other extends along the optical axis and the set repeats multiple times in a repeating interval greater than the width of the first structure section in the axis-intersecting direction.

In the form in which the second structure section has a refractive index distribution here, to concentrate light on the first structure section, the upper limit of the refractive index in the refractive index distribution is preferably lower than a total effective refractive index of the first structure section.

In case where the second structure section has a layered structure having a set of layers repeated multiple times, it is preferable to have the form;

in which the set includes a first kind of layer with attenuation of light substantially low to a negligible extent, and a second kind of layer with attenuation of light; or in which the second structure section is arranged such that the thickness ratio of multiple kinds of layers constituting a set is equal to each other, and total thickness of layers of each set varies each other.

The thickness of the first kind of layer is preferably smaller than so-called cut-off size of $\lambda/2n$, which is determined as a function of a refractive index n and a wavelength $\lambda$ of a propagated light.

These layered structures efficiently concentrate light on the first structure section.

A second light emitting head according to the invention is characterized in that it includes:

a propagating body which propagates light, the propagating body having a tapered two dimensional shape symmetrical with respect to a predetermined axis of symmetry; and a covering body which covers the propagating body so that the axis of symmetry is surrounded, the covering body confining light within the propagating body, the light emitting head which irradiates light propagating through the propagating body from a tip of the propagating body, wherein the propagating body has a two dimensional shape having a bottom edge intersecting the axis of symmetry, a pair of reflecting edges which sandwich the axis of symmetry and narrow the distance therebetween as receding from the bottom edge side, and a pair of extending edges extending along the axis of symmetry from the narrower end of the pair of reflecting edges.

Such a two dimensional shape can easily and accurately be created using lithographic techniques. It also provides the high degree of freedom in size, angle, and the like of the two dimensional shape because it is not restricted by a crystal orientation of the substrate material. With a pair of extending edges, light concentrated by a reflecting edge propagates between the pair of extending edges, enabling a micro aperture to be opened at any location halfway through the extending edges. In this way, the second light emitting head according to the invention facilitates its fabrication.

The second light emitting head according to the invention is preferably such that;

the propagating body has a layered structure consisting of multiple layers having the two dimensional shape, and the layered structure includes:

a first structure section having, a first well propagating layer which consists of a first low extinction material with attenuation of light substantially low to a negligible extent, a second well propagating layer which consists of a second low extinction material with attenuation of light substantially low to a negligible extent, and whose refractive index is larger than that of the first well propagating layer, a pair of the second well propagating layers sandwiching the first well propagating layer therebetween, and a poor propagating layer which consists of a material with any propagating characteristics, which may be non-propagative, poorer than that of the second well propagating layer, a pair of the poor propagating layers further sandwiching the first and second well propagating layers therebetween from the outside of the second well propagating layer; and a second structure section being located on one of two sides of the first structure section, the second structure section concentrating propagated light on the first structure section.

With such a layered structure, the second light emitting head according to the invention improves utilization efficiency of light and facilitates its alignment with other heads.

The second light emitting head according to the invention is preferably such that the covering body has a refractive index lower than that of the propagating body, or a negative relative dielectric constant.

According to the light emitting head provided with such a covering body, light is efficiently reflected and concentrated by the above reflecting edges.

The second light emitting head according to the invention preferably has the form;

in which, in the propagating body, a spacing d between the extending edges is expressed as $d \leq \lambda/2n$ with respect to a refractive index n of the propagating body and a wavelength $\lambda$ of propagated light, and in which the covering body has a refractive index lower than that of the propagating body by 1.0 or more at least in an area of the propagating body bounded by the extending edges.

According to the light emitting head in such a preferable form, light is efficiently propagated through a spacing smaller than so-called cut-off size of $\lambda/2n$.

A first information storage device according to the invention is characterized in that it irradiates light onto a predetermined information storage medium, and uses the irradiated light for at least one of information reproduction and information recording, and includes:

a light emitting head including, a first structure section including, a first well propagating section which consists of a first low extinction material with an imaginary part of a complex index of refraction substantially low to a negligible extent, the first well propagating section being located along an optical axis from an incident light origin to an exiting light destination, a second well propagating section which consists of a second low extinction material with an imaginary part of a complex index of refraction substantially low to a negligible extent, and whose real part of a complex index of refraction is larger than that of the first well propagating section, a pair of the second well propagating sections sandwiching the first well propagating section therebetween in at least one axis-intersecting direction intersecting the optical axis, and a poor propagating section which consists of a material with any propagating characteristics, which may be non-propagative, poorer than that of the second well propagating section, a pair of the poor propagating sections further sandwiching the first and second well propagating sections therebetween from the outside of the second well propagating section in the axis-intersecting direction, and a second structure section being located on one of two sides sandwiching the first structure section in the axis-intersecting direction, the second structure section concentrating light on the first structure section;

a light source which emits light; and a light introducing section which causes light emanated from the light source to enter into the light emitting head from the incident light origin for the light emitting head.

According to the first information storage device of the invention, a light emitting head which has high utilization efficiency of light and facilitates its alignment with other heads and which facilitates its fabrication, providing high volume access to information for a recording medium.

The first information storage device according to the invention preferably includes a magnetic head adjacent to the side on the light emitting head opposite to the second structure section with the first structure section in-between.

Provided with such a magnetic head, the first information storage device according to the invention can generate a magnetic field in a location near the light-irradiating area.

In case of so-called light assisted magnetic recording/reproducing device, which uses light as a source of heat to be generated on a surface of a medium, a magnetic head smaller in size than a light spot size could further increase the recording density because the recording density of information depends on the size of the magnetic head. When this light assisted magnetic recording/reproducing device is used to write information, light emitted from a light emitting head is irradiated onto a magnetic recording medium to increase the temperature of the magnetic recording medium, and, immediately after that, a magnetic field generated by a coil writes the information, so that information can be written with low magnetic field intensity.

The size of a writing magnetic core of a magnetic head for 1 Tb recording density reaches several tens nanometers. It is usually very difficult to align a light emitting head with a structure of such a size. According to the above information storage device of a preferred embodiment, however, because a magnetic head and a light emitting head are integrally fabricated by forming the magnetic head adjacent to the side on the light emitting head opposite to the second structure section with the first structure section in-between, the alignment is accomplished using the similar lithographic techniques as a magnetic head with the accuracy of fabrication.

A second information storage device according to the invention is characterized in that it irradiates light onto a predetermined information storage medium, and uses the irradiated light for at least one of information reproduction and information recording, and includes:
    a light emitting head including a propagating body which propagates light, the propagating body having a tapered two dimensional shape symmetrical with respect to a predetermined axis of symmetry, and a covering body which covers the propagating body so that the axis of symmetry is surrounded, the covering body confining light within the propagating body, the light emitting head which irradiates light propagating through the propagating body from a tip of the propagating body;
    a light source which emits light; and
    a light introducing section which causes light emanated from the light source to enter into the light emitting head from the incident light origin for the light emitting head,
    wherein the propagating body of the light emitting head has a two dimensional shape having a bottom edge intersecting the axis of symmetry, a pair of reflecting edges which sandwich the axis of symmetry and narrow the distance therebetween as receding from the bottom edge side, and a pair of extending edges extending along the axis of symmetry from the narrower end of the pair of reflecting edges.

According to the second information storage device of the invention, fabrication of a light emitting head is facilitated so that a device which provides high volume access to information will easily be available.

As used herein, an information storage device of the invention is described only in a basic form. However, this is merely for the purpose of avoiding duplication, and an information storage device of the invention encompasses various forms corresponding to the above light emitting head as well as the basic form.

A method for manufacturing a composite head, which is mounted on a slider and has a recording light emitting head, a recording magnetic head, and a reproducing magnetic head, according to the invention is characterized in that it includes:
    a magnetic head forming step that forms the reproducing magnetic head and the recording magnetic head in this order in a stacked manner on a sacrificial substrate;
    a light emitting head forming step that forms the recording light emitting head on the recording magnetic head;
    a joining step that joins the recording light emitting head to a slider body; and
    a removing step that removes the sacrificial substrate.

As used herein, "slider body" is not limited to the fabricated, slider-shaped one, and may be an unprocessed substrate and the like to be used as a slider body in the future.

To bring a head of an information storage device close to a recording medium, there is conventionally known a technique that floats a slider that has a head mounted thereon on the recording medium.

In consideration of floating stability, the head is often mounted on an end of the slider on the downstream side in the moving direction of the recording medium. In addition, when both irradiation of light and application of magnetism are used to record information, typically, light must be emitted on the upstream side in the moving direction of the recording medium and magnetism must be applied on the downstream side. Therefore, viewed from the slider side, the recording light emitting head and the recording magnetic head are preferably formed in this order in a stacked manner.

However, in the case where a recording light emitting head is formed on a substrate to be used as a slider body and a recording magnetic head or reproducing magnetic head is formed on the recording light emitting head, if the recording magnetic head or the reproducing magnetic head is smaller than the recording light emitting head, then a problem arises in that the recording light emitting head is also processed and damaged by FIB or ion milling used to process the recording magnetic head or the reproducing magnetic head. Alternatively, in the case where a buffer layer is provided in a thickness such that the damage can be avoided, a problem arises in that the recording light emitting head and the recording magnetic head are spaced too far to record information because a buffer layer having a thickness of several micron meters is required.

In contrast, according to the composite head manufacturing method of the invention, the recording light emitting head is formed after the recording magnetic head or the reproducing magnetic head are formed, so that the damage to the recording light emitting head is avoided and the recording light emitting head and the recording magnetic head can be formed sufficiently close to each other. In addition, it is also advantageous that the shapes of the recording light emitting head and the recording magnetic head can be designed independently.

As described above, the present invention provides a light emitting head which has high utilization efficiency of light and facilitates its alignment with other heads and which facilitates its fabrication, information storage device which provides high volume access to information with such a light emitting head, and composite head manufacturing method suitable to manufacture a composite head having such a light emitting head.

DETAILED DESCRIPTION OF THE INVENTION

Embodiments of the present invention will be described with reference to the drawings.

Figure 1:
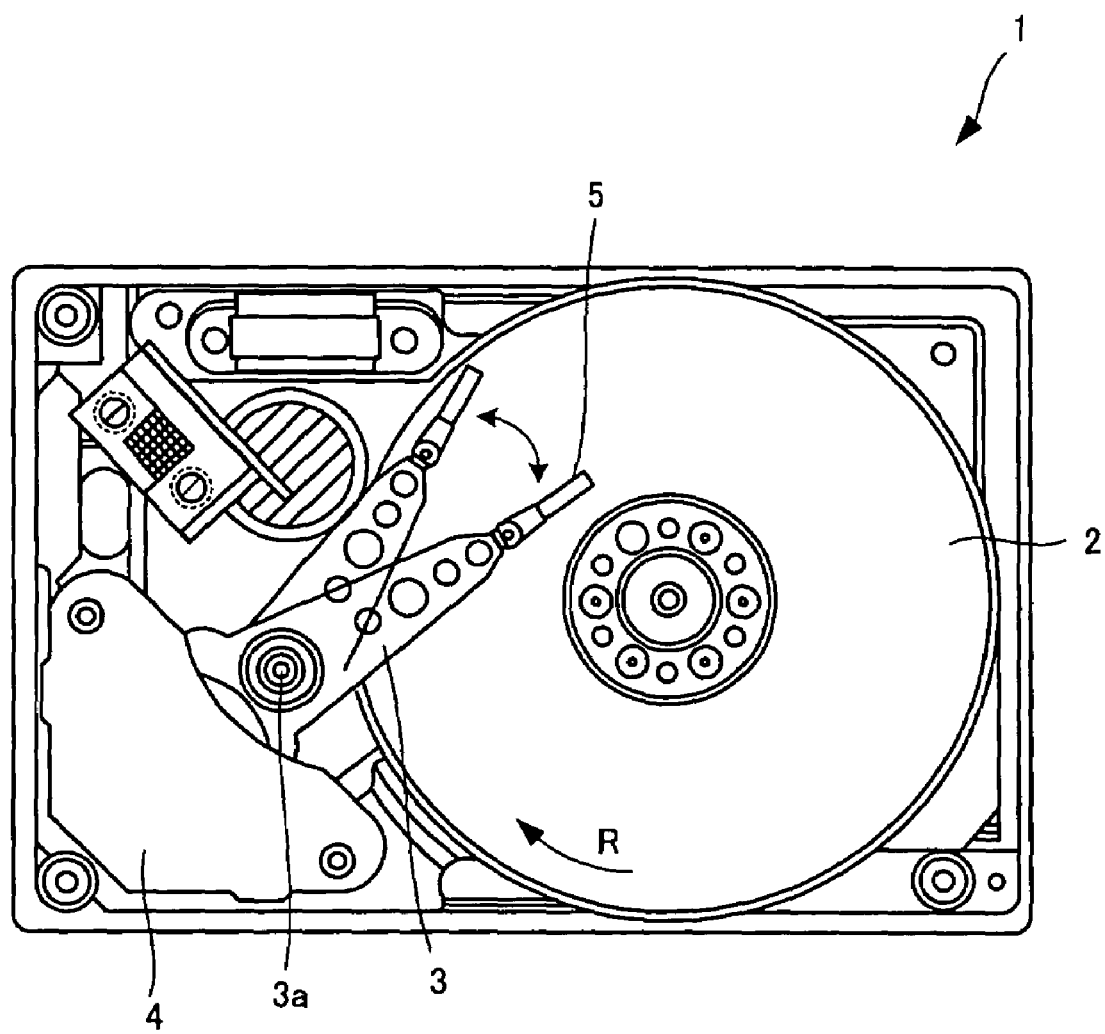
FIG. 1 shows one embodiment of the invention.

FIG. 1 shows one embodiment of the invention.

A light assisted magnetic recording/reproducing device 1 shown in FIG. 1 represents a first embodiment of an information storage device according to the invention, and incorporates a first embodiment of a light emitting head according to the invention. In FIG. 1, the light assisted magnetic recording/reproducing device 1 is shown exposing the inside of the housing, and the light assisted magnetic recording/reproducing device 1 includes a magnetic disk 2 that rotates in the direction indicated by arrow R, a slider 5 having a composite head described below, mounted thereon for recording and reproducing information to and from the magnetic disk 2, a carriage arm 3 which holds the slider 5 and turns about an arm shaft 3a along the surface of the magnetic disk 2, an arm actuator 4 which drives the carriage arm 3. The inside space of the housing is closed by a cover which is not shown.

In writing information to the magnetic disk 2 and reproducing information from the magnetic disk 2, the carriage arm 3 is driven by the arm actuator 4 consisting of a magnetic circuit and the composite head is accurately positioned on a desired track on the rotating magnetic disk 2 using the sample servo system. The composite head mounted on the slider 5 sequentially approaches each micro area arranged on each track of the magnetic disk 2 as the magnetic disk 2 rotates.

As the magnetic disk 2 shown in FIG. 1 rotates, micro areas, to (or from) which desired information is recorded (or reproduced), on the magnetic disk 2 pass a light emitting head 10, a recording magnetic head 20, and a reproducing magnetic sensor head 30 in this order.

Figure 2:
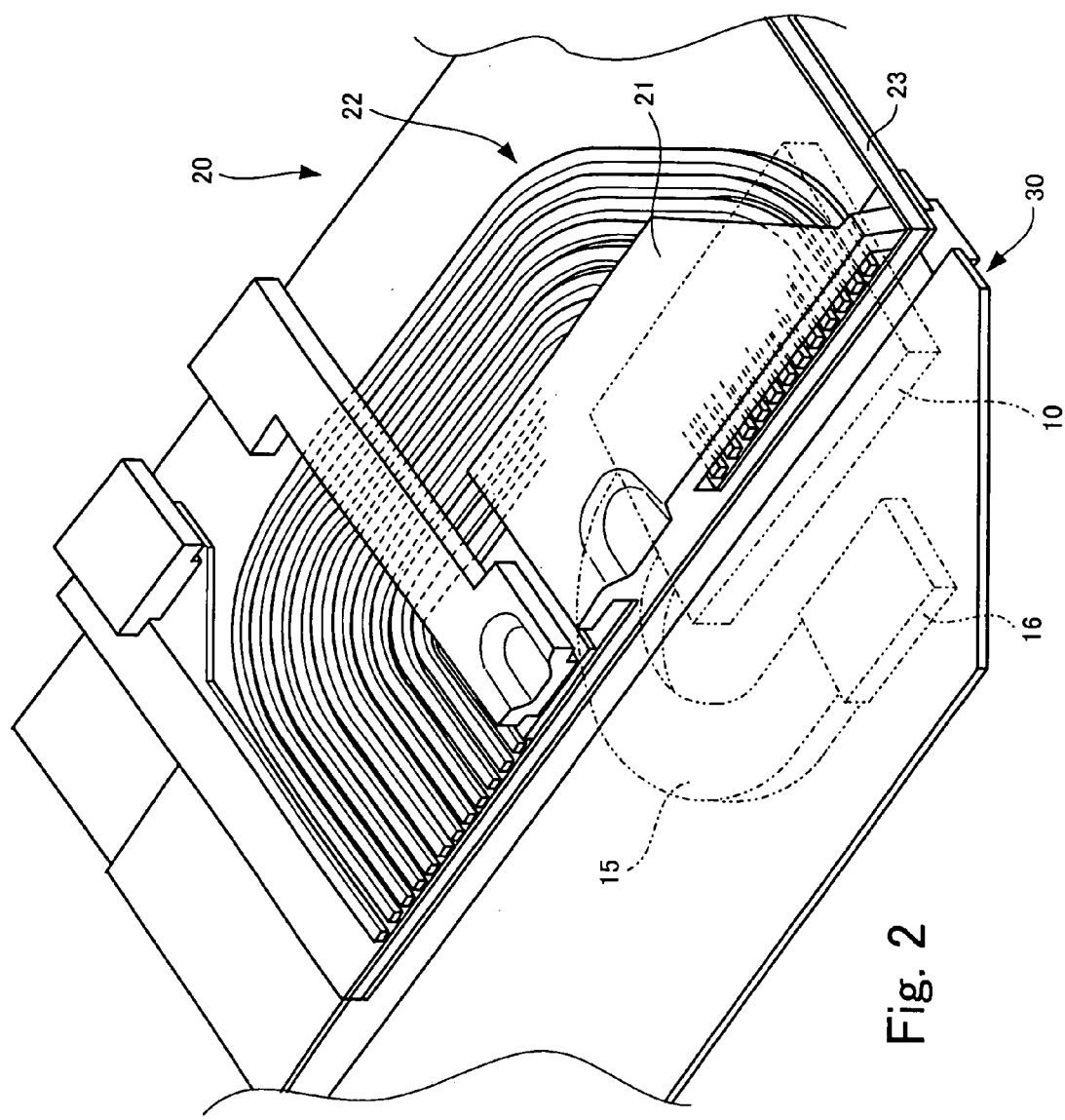
FIG. 2 is an enlarged view of a composite head mounted on a slider.

FIG. 2 is an enlarged view of the composite head mounted on the slider 5.

In the composite head shown in FIG. 2, the light emitting head 10, the recording magnetic head 20, and the reproducing magnetic sensor head 30 are integrated by using lithographic techniques, and the light emitting head 10, the recording magnetic head 20, and the reproducing magnetic sensor head 30 are formed in this order from the side of the slider 5 on a tip of the slider 5 shown in FIG. 1, and arranged in proximity to the magnetic disk 2.

The light emitting head 10 represents a first embodiment of a light emitting head according to the invention, and is connected to an optical waveguide 15 which guides a laser beam from a laser diode 16. The optical waveguide 15 represents an example of a light introducing section of the invention, and is coupled to a laser beam from the laser diode 16 in a end-injected way, for example.

The light emitting head 10 irradiates light guided via the optical waveguide 15 onto the magnetic disk 2. However, because the light emitting head 10 is a kind of a near field optical head as described above, light does not exit as a propagating wave, but instead partially exists as an oscillating electric field in proximity (one-tenth or less of a wavelength of light) to the light emitting head 10, so that when the light emitting head 10 is brought sufficiently close to the magnetic disk 2, the oscillating electric field acts similarly to light as a wave.

The recording magnetic head 20 consists of an upper core 21, a coil 22 for generating a magnetic field, and a lower core 23 which also serves as a magnetic shield, and magnetism is generated in a gap between the upper core 21 and the lower core 23. The upper core 21 of the recording magnetic head 20 is provided adjacent to a light exit of the light emitting head 10 and accurately aligned by the integration through the use of lithographic techniques, the recording magnetic head 20 generates a magnetic field in an area close to the light-irradiating area with the light emitting head 10. As described below, the distance between these areas is a small distance of several tens nanometers or less, so that the light and the magnetic field are generated and irradiated onto the same track from the outer to inner periphery of the magnetic disk.

The reproducing magnetic head 30 has so-called GMR (giant magnetoresistive) film, and can accurately sense a magnetic field.

In recording information, light is irradiated by the light emitting head 10 to heat a desired area on the magnetic disk 2, and immediately after that, a magnetic field is applied by the recording magnetic head 20, according to an electrical recording signal. In this way, information can be recorded with a small magnetic field intensity.

In reproducing information, information recorded in the form of the magnetization direction of each micro area is retrieved by the reproducing magnetic sensor head 30 as an electrically reproduced signal depending on a magnetic field generated by each magnetization of micro areas.

Details of the construction of the light emitting head 10 will now be described.

Figure 3:
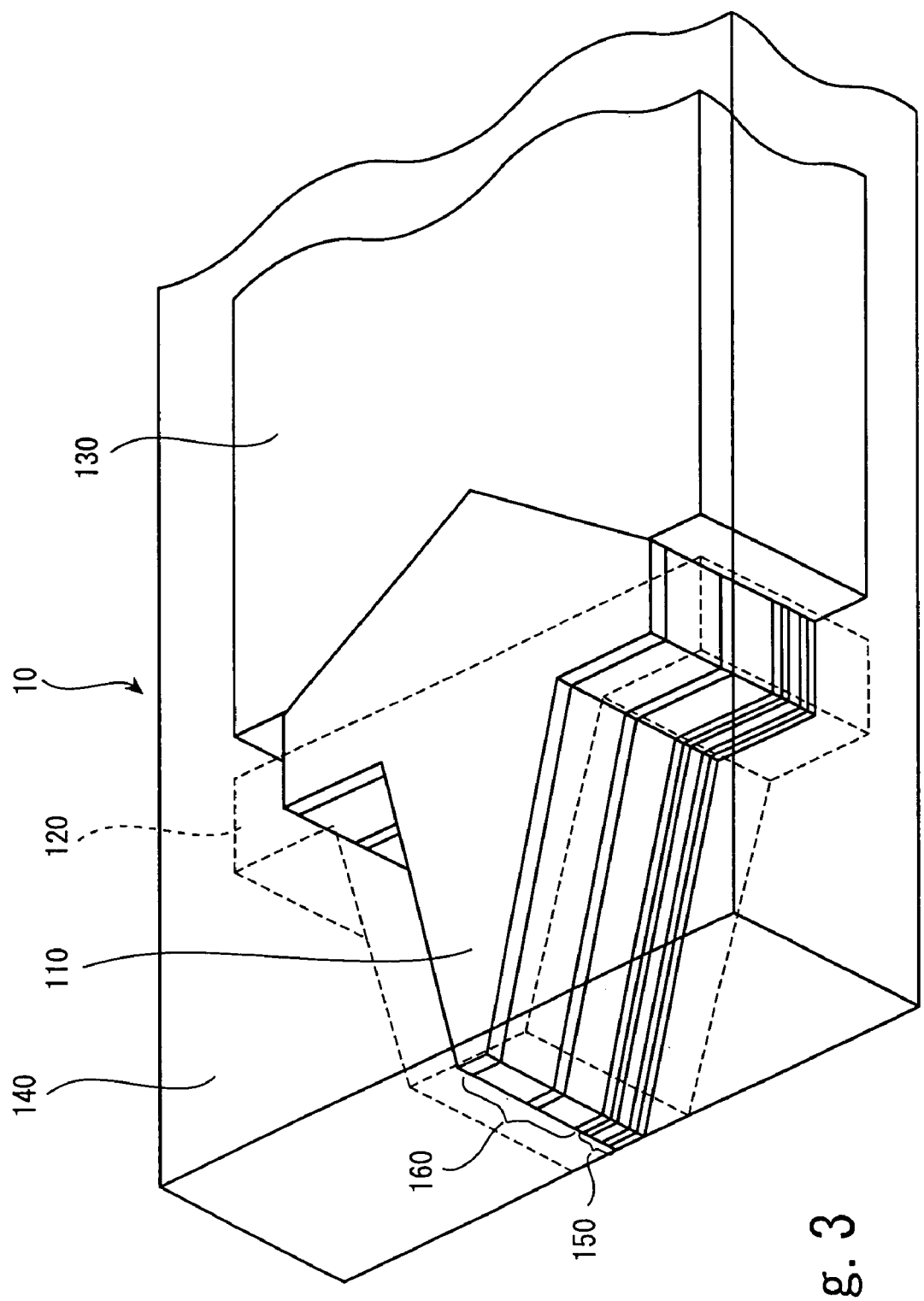
FIG. 3 is an enlarged perspective view of a light emitting head.

FIG. 3 is an enlarged perspective view of the light emitting head 10.

The light emitting head 10 has a core 130 consisting of ZnS which is connected to the optical waveguide 15 shown in FIG. 2 to introduce light, a clad 140 consisting of $MgF_2$ which confines light within the core 130, a tapered propagating body 110 formed of a multi-layered dielectric material which propagates and concentrates light introduced into the core 130 to irradiate from the tip, and a covering body 120 consisting of Al which covers the propagating body 110 to confine light within the propagating body.

The tip of the light emitting head 10 is located in an area with the highest electromagnetic field intensity concentrated by the propagating body 110. The propagating body 110 and the core 130 are optically connected to each other. The core 130 and the propagating body 110 have a different refractive index from each other, and light from the core 130 is refracted by a bottom edge protruding toward the core 130 side and enters the propagating body 110 toward the center thereof, so that concentration efficiency is improved within the propagating body 110.

The covering body 120 reflects propagated light into the propagating body 110 to concentrate the light and to prevent the propagated light from bleeding from anywhere other than the tip. If a metal is employed as a material for the covering body 120, sufficient reflection can be obtained even with a small angle of incidence at a side surface of the tapered portion of the propagating body 110, so that sufficient ability of concentrating light can be acquired even with large apex angle of the tapered portion. Such a large apex angle enables the propagation distance of light to be shorter within the propagating body 110, resulting in a small internal loss and high propagation efficiency in the propagating body 110. In the embodiment, Al (n=0.49, k=4.86) is used for an exemplary metal.

The propagating body 110 has a layered structure consisting of dielectrics. Although details will be described below, the layered structure can primarily be categorized as a first structure section 150 to which light is concentrated, and a second structure section 160 which biases the propagated light to the first structure section 150. The second structure section 160 is provided only on one side of the first structure section 150.

An exemplary fabrication procedure of such a light emitting head 10 starts with applying a layered structure identical to the propagating body 110 over a surface of a substrate. A pattern for the propagating body 110 is then created in a photoresist by using lithographic exposure process and etched to form the propagating body 110. The core 130 connected to the propagating body 110 is then formed by using a lift-off and the like. Similarly, a lift-off and the like is used to form the covering body 120 by hiding the core 130 with a photoresist and the like and coating the tapered portion of the propagating body 110 and the like with aluminum. The clad 140 is then applied so that it covers the propagating body 110 and the core 130. Finally, the tip of the propagating body 110 is removed by FIB, ion milling, or the like to form a light emitting aperture.

Figure 4:
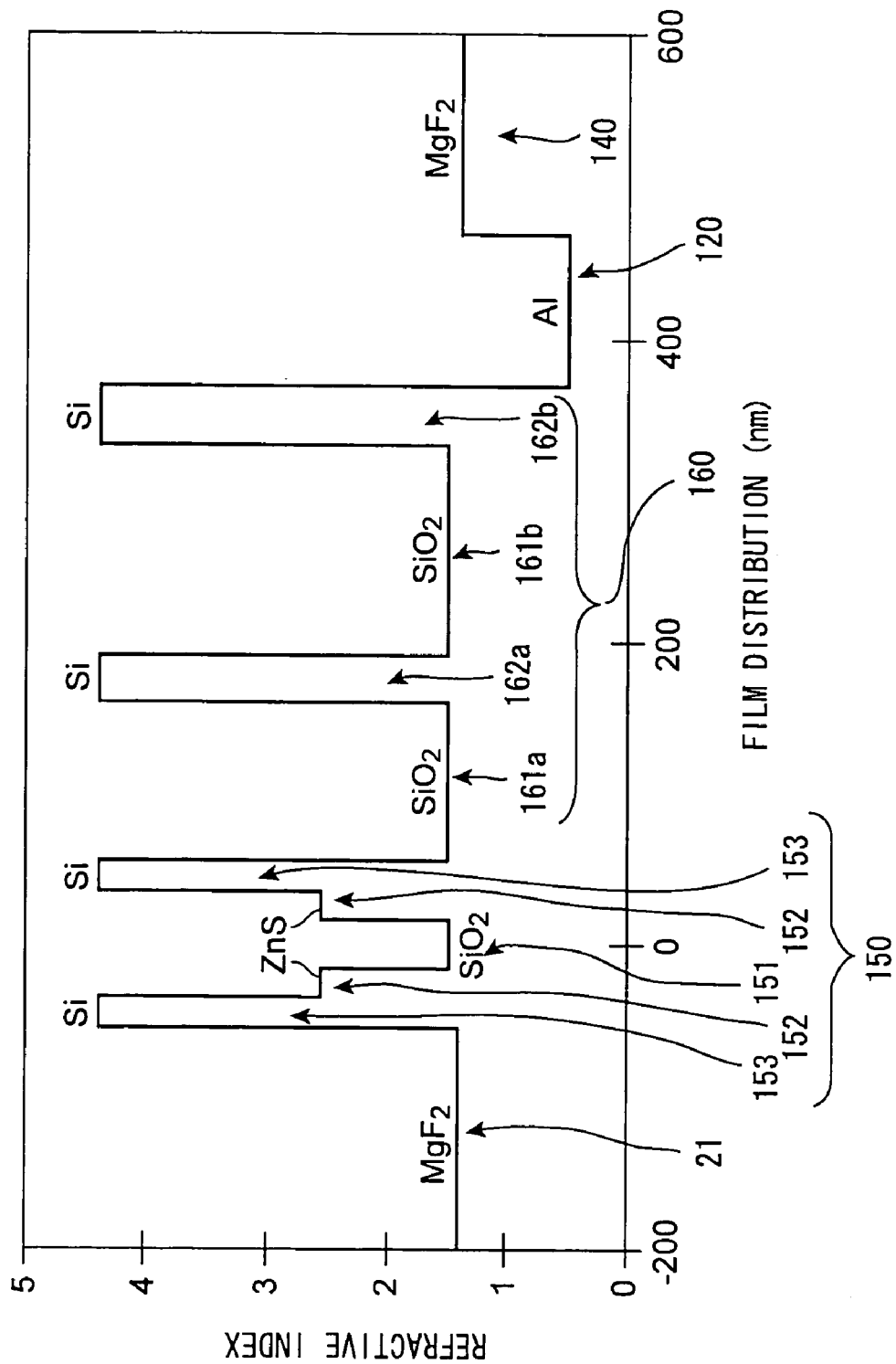
FIG. 4 is a graphical representation of a refractive index distribution representing a layered structure of a light emitting head.

FIG. 4 is a graphical representation of a refractive index distribution representing a layered structure of a light emitting head 10 in terms of a bulk material with respect to light having a vacuum wavelength of 400 nm.

The axis of abscissas of the graph shows the distance of film distribution with the origin defined in the center of the exiting light of the light emitting head, and the axis of ordinates shows the refractive index of each film.

In FIG. 4, the first structure section 150 is shown made up of a first layer 151 consisting of $SiO_2$ (n=1.48) having a thickness of 30 nm, a pair of second layers 152 each consisting of ZnS (n=2.437) having a thickness of 20 nm, which sandwiches the first layer 151 therebetween, and a pair of third layer 153 each consisting of Si (n=4.380, k=2.02) having a thickness of 20 nm, which further sandwiches the first layer 151 and the second layer 152 therebetween. Here, Si is an opaque dielectric material with a high relative dielectric constant, $SiO_2$ is a transparent dielectric material, and ZnS is a transparent dielectric material having a refractive index larger than $SiO_2$ by approximately 1.0. In the case where an asymmetric profile of a light spot may be accepted, a layered structure which has a second layer 152 adjacent only to one side of the first layer 151 may be employed instead of the pair of second layer 152, which is provided according to the embodiment.

As shown in the graph in FIG. 4, because the second layer 152 consisting of ZnS with an intermediate refractive index is provided between the first layer 151 consisting of $SiO_2$ with a low refractive index and the third layer 153 consisting of Si with high refractive index, the first layer 151 is prevented from contacting with the third layer 153 with attenuation, and a propagating wave is efficiently propagated across the border between the first layer 151 and the second layer 152 since an effective refractive index of the second layer 152 is influenced and improved by the higher refractive index of the third layer 153.

In the graph in FIG. 4, a second structure section 160 is also shown made up of a low-refractive-index layer 161 consisting of $SiO_2$ having a thickness of 100 nm, a high-refractive-index layer 162a consisting of Si having a thickness of 30 nm, a low-refractive-index layer 161b consisting of $SiO_2$ having a thickness of 140 nm, and a high-refractive-index layer 162b consisting of Si having a thickness of 42 nm. The second structure section 160 thus has a structure in which a set of a low-refractive-index layer and a high-refractive-index layer, which varies in refractive index each other by 1.0 or more, repeats. The thickness ratio of the low-refractive-index layer and the high-refractive-index layer is constant in each set, and total thickness of layers of each set varies each other. With the layered structure of the second structure section 160, propagated light along layers interferes between layers, so that the propagated light is biased to the first structure section 150 and ultimately concentrated into the first structure section 150. In the layered structure shown in FIG. 4, although a set closer to the first structure section 150 has thinner total thickness of layers, it is preferable that the set closer to the first structure section 150 has thicker total thickness of layers if the set of layers repeats 3 times or more. The thickness of low-refractive-index layer 161a, 161b is smaller than so-called cut-off size of $\lambda/2n$ ($\lambda$ is a wavelength and n is an effective refractive index), and this small thickness of low-refractive-index layer 161a, 161b causes propagated light to efficiently be biased to the first structure section 150 side. The second structure section 160 must have sufficient propagation distance to effect sufficient ability of concentrating light, and therefore, the propagating body 110 shown in FIG. 3 has a sufficient length of 1400 nm.

It is desirable to design the thickness of each layer made up of layered structures of the first structure section 150 and the second structure section 160 so that propagation efficiency and ability of concentrating light can be improved. However, because propagated light will be reflected on each of layers in a multiplex way, it is practical to take a design approach in which propagation states of light is confirmed by using a electromagnetic field simulator for designing. The thickness of each layer described above is an example of a thickness designed using such an approach, and for example, although the first layer 151 of the first structure section 150 is shown as 30 nm, the first layer 151 may be designed to have a larger thickness if a larger profile of light spot is required than the profile of the embodiment.

In the graph in FIG. 4, an upper core 21 (see FIG. 2) is also shown adjacent to the first structure section 150 on the opposite side to the second structure section 160, and the distance from the center of the first structure section 150 to the upper core 21 as short as several tens nanometers. Although the upper core 21 is shown consisting of $MgF_2$ (n=1.384) in this graph, this material is selected for convenience of calculation in the simulator described above, and the upper core 21 generally consists of a material for a magnetic head.

The graph in FIG. 4 also shows a covering body 120 consisting of Al which is adjacent to the second structure section 160, and a clad 140 consisting of $MgF_2$ which is adjacent to the covering body 120.

In the graph in FIG. 4, a second layer 152 consisting of ZnS is shown, and it is conceivable that a material for the second layer 152 may be an oxide material having a high refractive index. However, because the oxide material having a high refractive index will be brought adjacently to the third layer 153 consisting of Si, it would be necessary to reduce the possibility that the third layer 153 is oxidized as much as possible when it is applied. In case of the thickness of layer as shown in FIG. 4, the shape of the light spot profile could be degraded unless the oxidization of the third layer 153 is approximately 3 nm or less.

Figure 5:
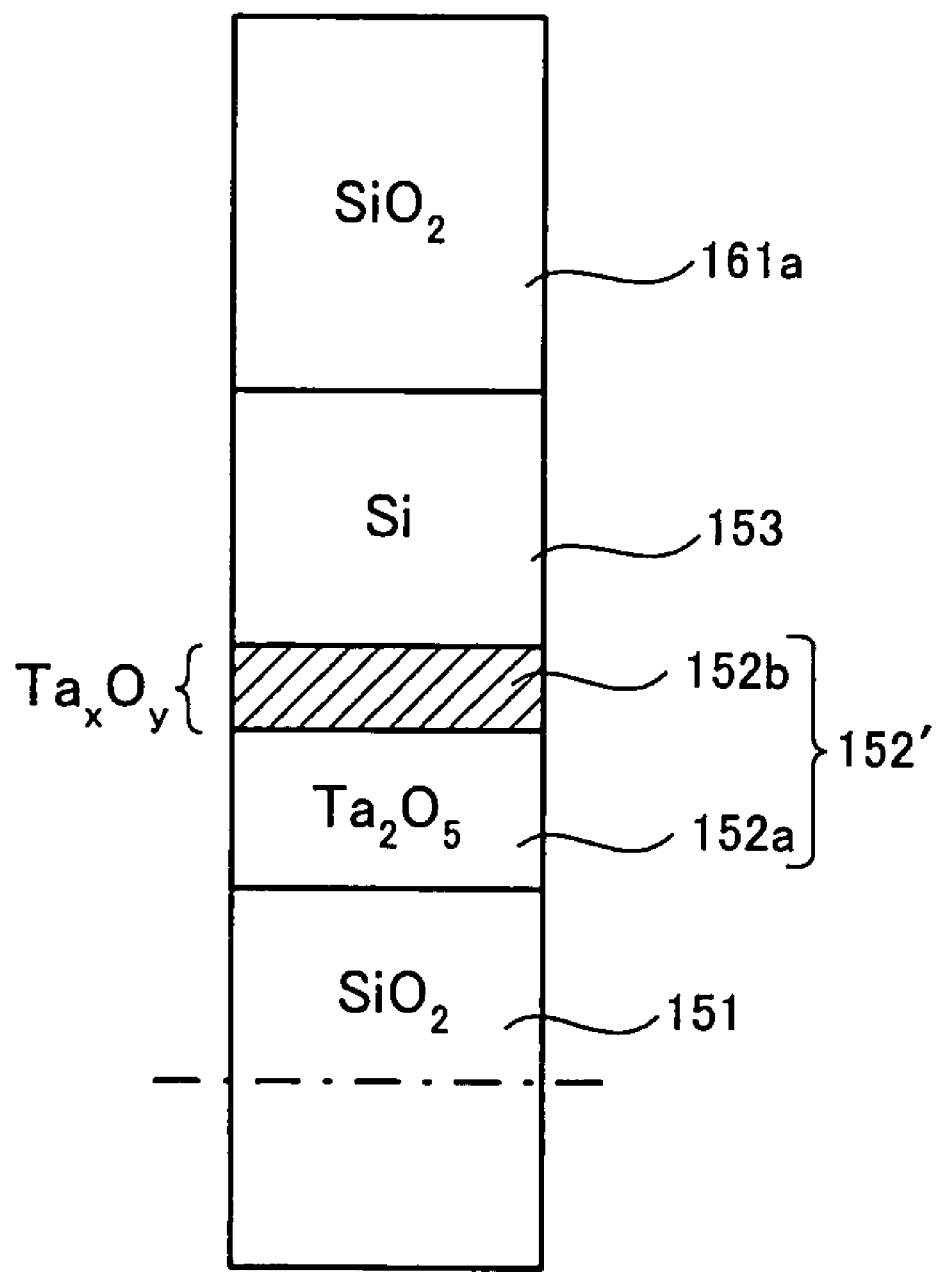
FIG. 5 shows a layered structure which employs a second layer consisting of an oxide material having a high refractive index.

FIG. 5 shows a layered structure which employs a second layer consisting of an oxide material having a high refractive index.

In FIG. 5, a second layer 152' which employs $Ta_2O_5$ as an oxide material having a high refractive index is shown, and the first layer 151 consisting of $SiO_2$ and the third layer 153 consisting of Si are provided to sandwich the second layer 152' therebetween. The third layer 153 further has the low-refractive-index layer 161a consisting of $SiO_2$ adjacent thereto.

The second layer 152' shown here is made up of a body portion 152a of about 20 nm, and an antioxidant film 152b of about 5 nm consisting of $Ta_XO_Y$ (X=1 or 2, Y=0, 1, 2, 3, 4, or 5), and the antioxidant film 152b prevents oxidization of the third layer 153. The material for the antioxidant film 152b may preferably be a dielectric rather than a metal which degrades propagation efficiency. The thickness of the antioxidant film 152b depends on the performance of a film-forming apparatus, and may be thinner.

Figure 6:
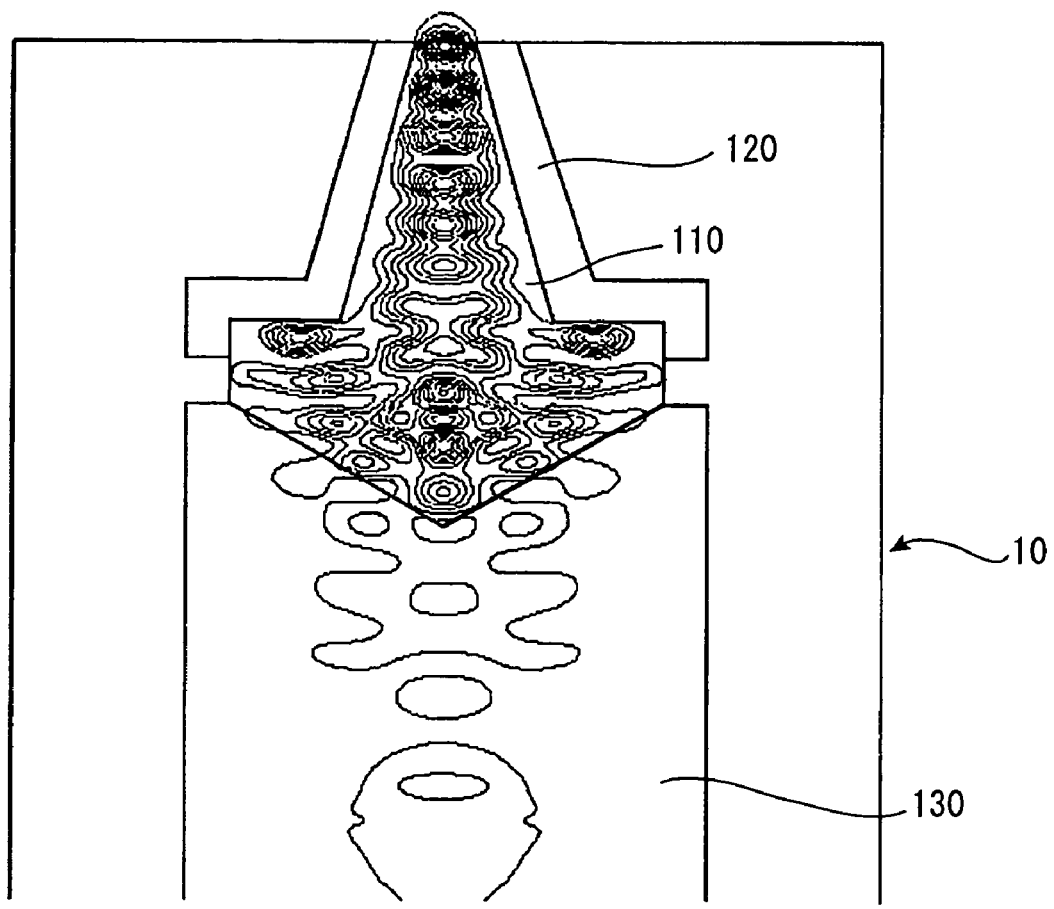
FIG. 6 is a front view illustrating a result of a simulation for an electric field intensity distribution according to the embodiment.
Figure 7:
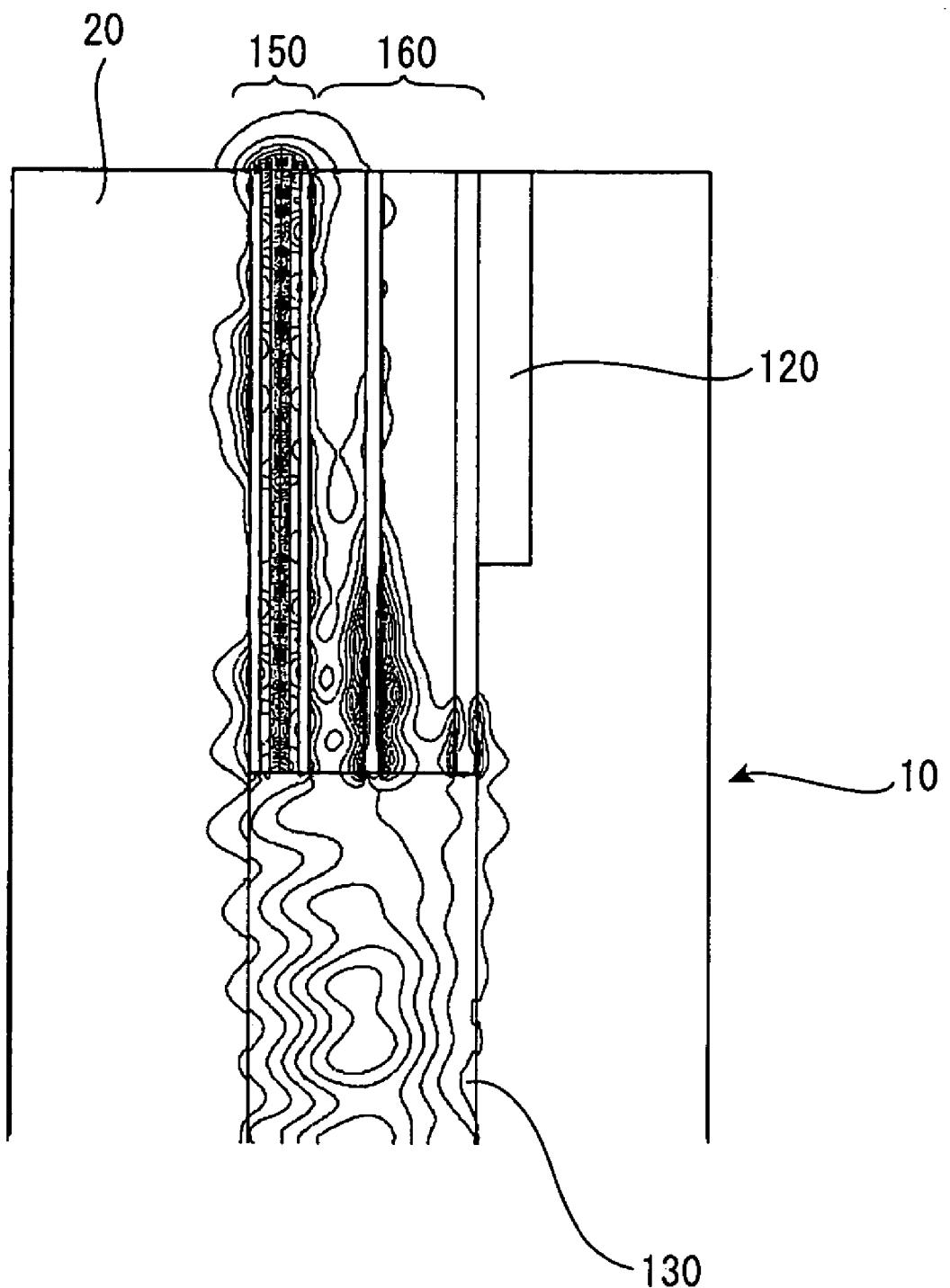
FIG. 7 is a side view illustrating a result of a simulation for an electric field intensity distribution according to the embodiment.

FIG. 6 is a front view illustrating a result of a simulation for an electromagnetic field intensity distribution according to the embodiment, and FIG. 7 is a side view illustrating the result.

The light whose λ is 400 nm enters the propagating body 110 from the core 130, and an intense light spot is formed on the tip of the propagating body 110 by reflection on the border between the propagating body 110 and the covering body 120 or by concentration into the first structure section 150 through the second structure section 160. The light spot is formed at the tip of the first structure section 150 located on the end of the light emitting head 10, and thus the distance between the light spot and the recording magnetic head 20 is short. Therefore, the distance between magnetism generated by the recording magnetic head 20 and the light spot is also short, providing high volume access to information.

The propagation efficiency of the propagating body 110 according to the invention is approximately 4% in terms of a ratio of the amount of light in the light spot at the tip of the first structure section 150 to the amount of incident light. The spot profile or propagation efficiency may vary by optimizing the thickness and the like of the first structure section 150 depending on purposes. For example, if only the first layer ($SiO_2$ layer) of the first structure section 150 is made thinner while keeping other properties the same, the spot profile is reduced, even though propagation efficiency is decreased.

Figure 8:
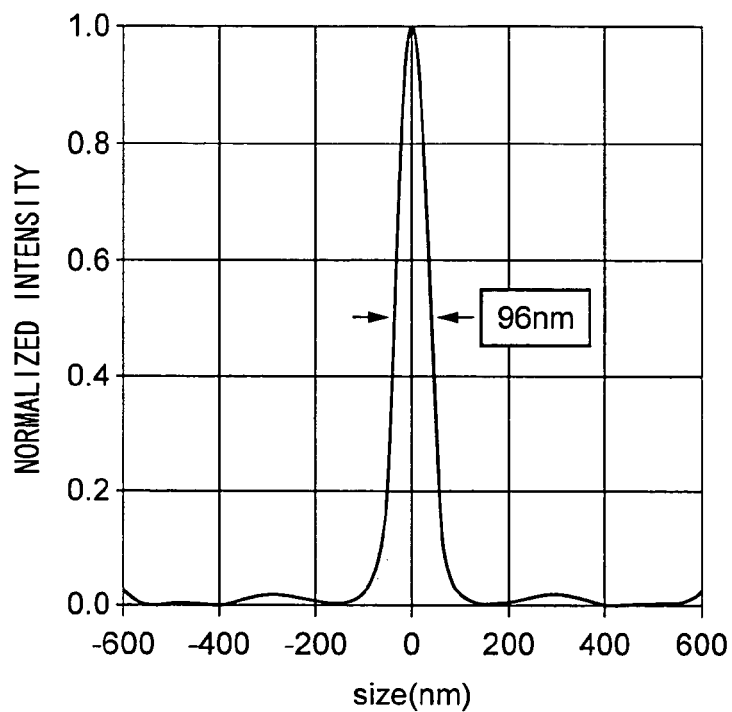
FIG. 8 is a graphical representation illustrating a profile (intensity distribution) in the X direction of a light spot.
Figure 9:
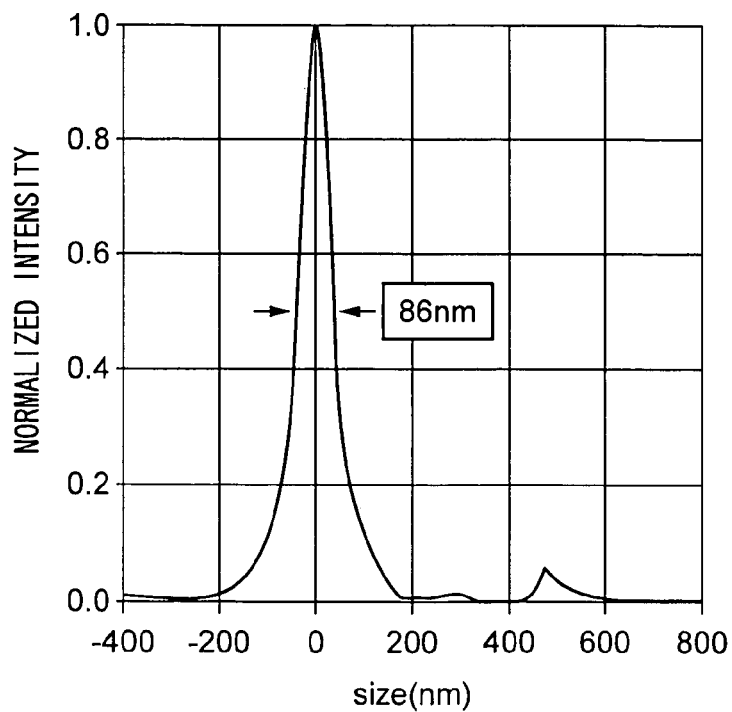
FIG. 9 is a graphical representation illustrating a profile (intensity distribution) in the Y direction of a light spot.

FIG. 8 and FIG. 9 are a graphical representation illustrating a profile (intensity distribution) of a light spot.

The axis of abscissas of FIG. 8 represents a position in the direction (X direction) along the layer of the layered structure of the light emitting head, and the axis of abscissas of FIG. 9 represents a position in the direction of film thickness (Y direction) of the layered structure of the light emitting head. The axes of ordinates of FIGS. 8 and 9 represent an intensity of light normalized with the center intensity of the light spot specified as 1.0.

The graphs of FIGS. 8 and 9 show profiles of light spots in near fields away from the exit surface by about 15 nm.

In the embodiment, a small light spot having a full width at half maximum of 96 nm in the X direction and 86 nm in the Y direction is provided. An unwanted side lobe in the profile is also suppressed under several percent with respect to the center intensity. Although these profiles are obtained away from the exit surface by 15 nm, as the distance from the exit surface becomes smaller, that is, the floating level becomes lower, the profile in the Y direction approaches the thickness of the first layer 151.

Because such a small light spot heats only a minimum required area on a magnetic disk for magnetic recording, a light assisted magnetic recording/reproducing device according to the invention enables information to be recorded and reproduced with a high recording density on the level of 1 Tb.

Having described the first embodiment of the invention, further embodiments will now be described. In each embodiment described below, because the basic form of a light assisted magnetic recording/reproducing device is common and only a light emitting head portion is different, only the light emitting head will be described below. The common components to the embodiments will have a like reference numeral as required and a duplicated description will be omitted.

Figure 10:
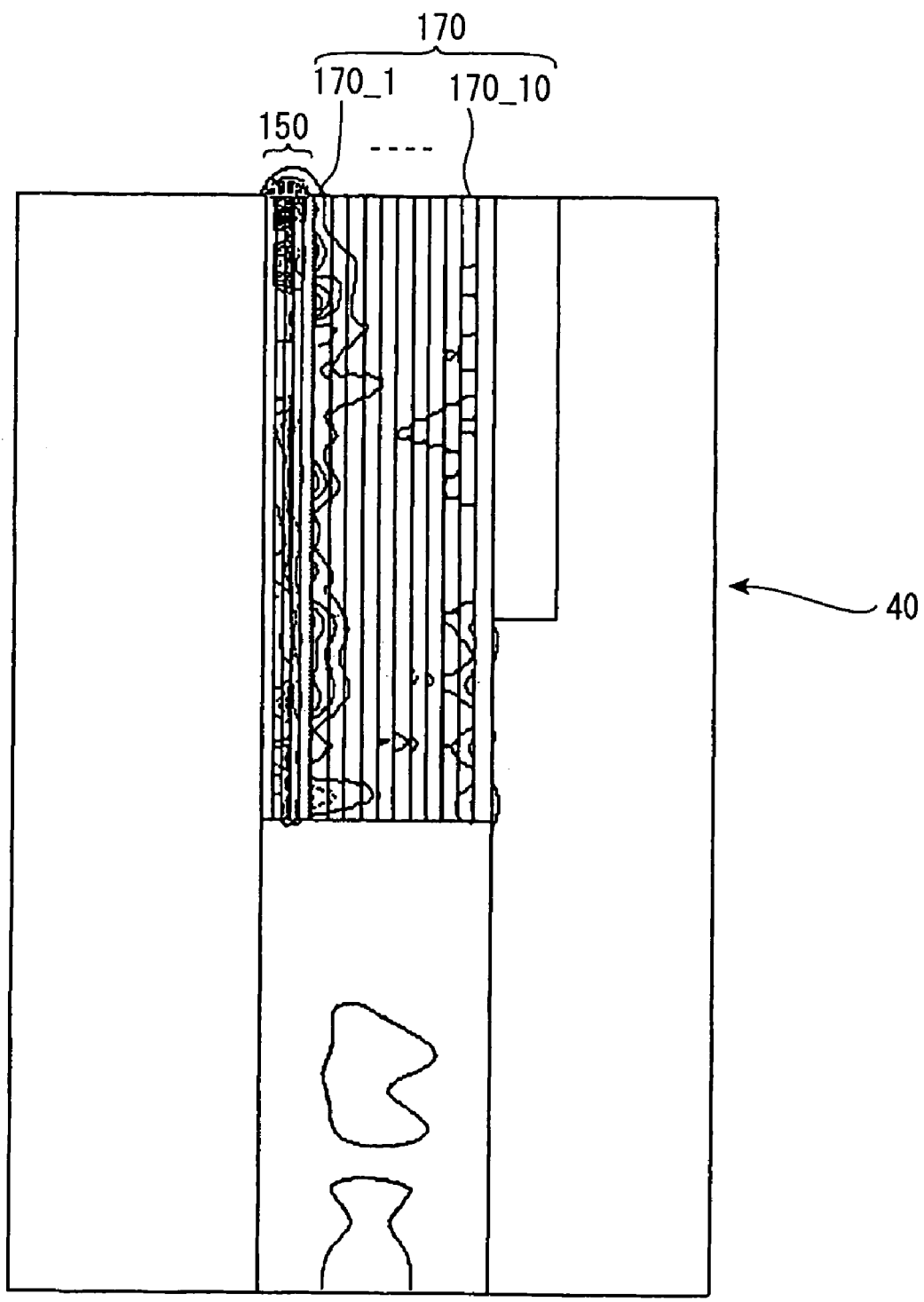
FIG. 10 shows a second embodiment of a light emitting head according to the invention.

FIG. 10 shows a second embodiment of a light emitting head according to the invention.

The light emitting head 40 shown in FIG. 10 is provided with a first structure section 150 and a second structure section 170, and the second structure section 170 has 10 dielectric layers 170_1, ..., 170_10 varying in refractive index each other which are stacked in the order. The refractive index of each dielectric layer 170_1, ..., 170_10 is n=2.4, 2.3, ..., 1.6, 1.5 from the one close to the first structure section 150, and the thickness of each layer is 30 nm. Each of these dielectric layers 170_1, ..., 170_10 is, for example, a superposition of ZnS (n=2.437) and SiO$_2$ (n=1.48) in the form of multi-layered film thin enough to be optically considered as a homogeneous medium, and is adjusted in the component ratio to form a layer with an intermediate refractive index.

The light entering the second structure section 170 according to the second embodiment is biased toward the side with a higher refractive index (i.e. the first structure section 150 side) due to the difference between dielectric layers 170_1, ..., 170_10, and ultimately concentrated into the first structure section 150.

Figure 11:
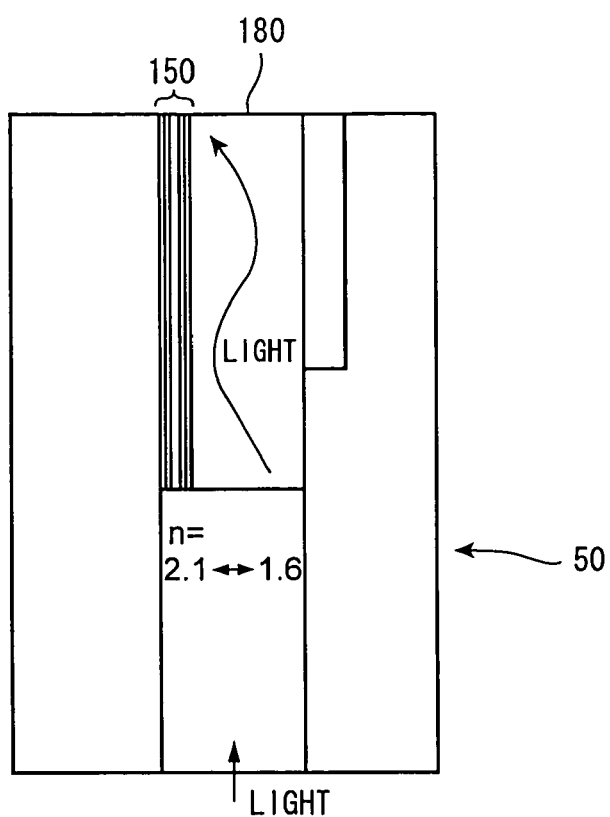
FIG. 11 shows a third embodiment of a light emitting head according to the invention.

FIG. 11 shows a third embodiment of a light emitting head according to the invention.

A light emitting head 50 shown in FIG. 11 is provided with a second structure section 180 having a continuous and uniform refractive index distribution from n=2.1 to n=1.6, and the refractive index distribution has a higher refractive index toward the first structure section. According to the second structure section 180, light is concentrated into the first structure section 150 because propagated light is biased and travels toward a higher refractive index area. In addition, according to the second structure section 180, a reflection generated on a border between materials having different refractive index each other is suppressed, resulting in high propagation efficiency.

The continuous refractive index distribution in the second structure section 180 can be provided by mixing two or more kinds of materials having different refractive index each other. For example, by mixing and applying SiO$_2$ and Nb$_2$O$_5$ in a sputter apparatus RAS (Radical Assisted Sputtering), and gradually varying the component ratio as the film grows, the second structure section 180 with refractive index controlled from 1.6 to 2.1.

In the second structure section 180 having such a refractive index distribution, propagated light will propagate while reflected within the second structure section 180 as shown in FIG. 11 because the thickness of the second structure section 180 exceeds a cut-off size. It is therefore desirable to form the second structure section 180 in a length such that light can reach the tip when it is closest to the first structure section 150 side, also in consideration of reflection, in order to prevent unwanted peaks from appearing on the tip side of the second structure section 180.

Figure 12:
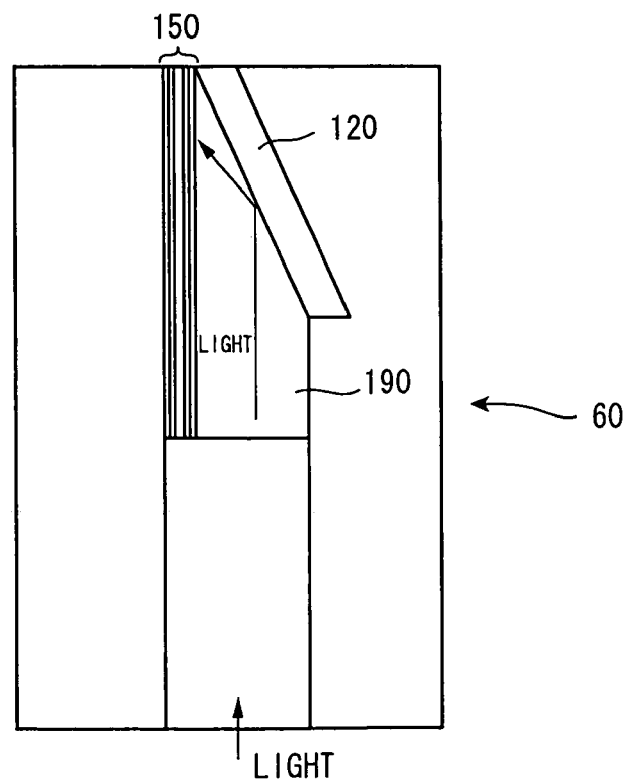
FIG. 12 shows a fourth embodiment of a light emitting head according to the invention.

FIG. 12 shows a fourth embodiment of a light emitting head according to the invention.

A light emitting head 60 shown in FIG. 12 is provided with a second structure section 190 consisting of a homogeneous material having an uniform refractive index. Because the material having an uniform refractive index by itself is not able to concentrate light onto the first structure section 150, the tip side of the second structure section 190 is obliquely removed by FIB or milling and covered with the covering body 120, so that the obliquely removed area serves a reflecting surface. In the second structure section 190, light is reflected and concentrated onto the first structure section 150 by the reflecting surface.

Figure 13:
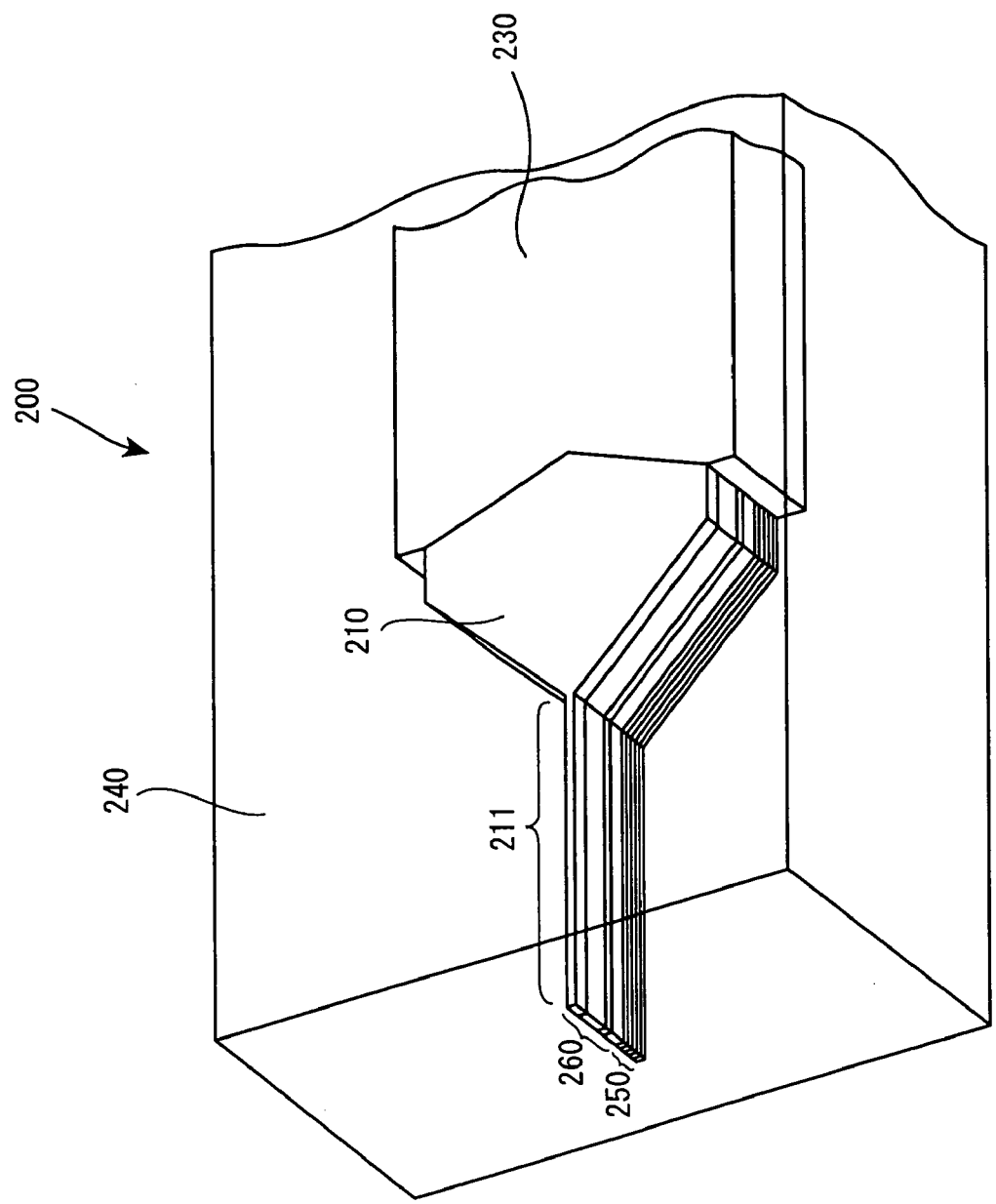
FIG. 13 shows a fifth embodiment of a light emitting head according to the invention.

FIG. 13 shows a fifth embodiment of a light emitting head according to the invention.

Similarly to the light emitting head according to the first embodiment, a light emitting head 200 shown in FIG. 13 is provided with a core 230 consisting of ZnS, and a clad 240 consisting of MgF$_2$ which confines light within the core 230. It is further provided with a propagating body 210 which has an extended section 211 having a width of, for example, 24 nm, which is the same width as the tip of the upper core 21 of the light emitting head 20 shown in FIG. 2, and the propagating body 210 is covered with the clad 240. This means that the fifth embodiment has no covering body 120 which is provided in the first embodiment, and facilitates a simplified fabrication process. It is desirable, however, that the angle of inclination of the oblique side of the propagating body 210 constitutes an angle which satisfies the angle of total reflection of propagated light for a sufficient propagation efficiency. In an example shown in FIG. 13, the apex angle of the oblique side is the same angle as the upper core, that is 90 degrees for example.

The propagating body 210 here is also provided with a first structure section 250 and a second structure section 260, which have similar layered structures to the layered structure of the propagating body according to the first embodiment.

An exemplary fabrication procedure of such a light emitting head 200 starts with applying a layered structure identical to the propagating body 210 over a surface of a substrate. A pattern for the propagating body 210 is then created in a photoresist by using lithographic exposure process and etched to form the propagating body 210. At this time, the accurate alignment can be provided by forming the extended section 211 aligned with the position of the upper core 21 of the recording magnetic head 20 (see FIG. 2). The core 230 connected to the propagating body 210 is then formed by using a lift-off and the like. The clad 240 is then formed so that it covers the whole of the propagating body 210 and the core 230. Finally, the tip of the extended section 211 and the upper core of the magnetic head 20 are removed at the same time by FIB, ion milling, or the like to form a light emitting aperture.

The propagating body 210 of the light emitting head 200 has the extended section 211 which provides the high degree of freedom in a location for creating a light emitting aperture, and the light emitting head 200 provides superior workability.

Figure 14:
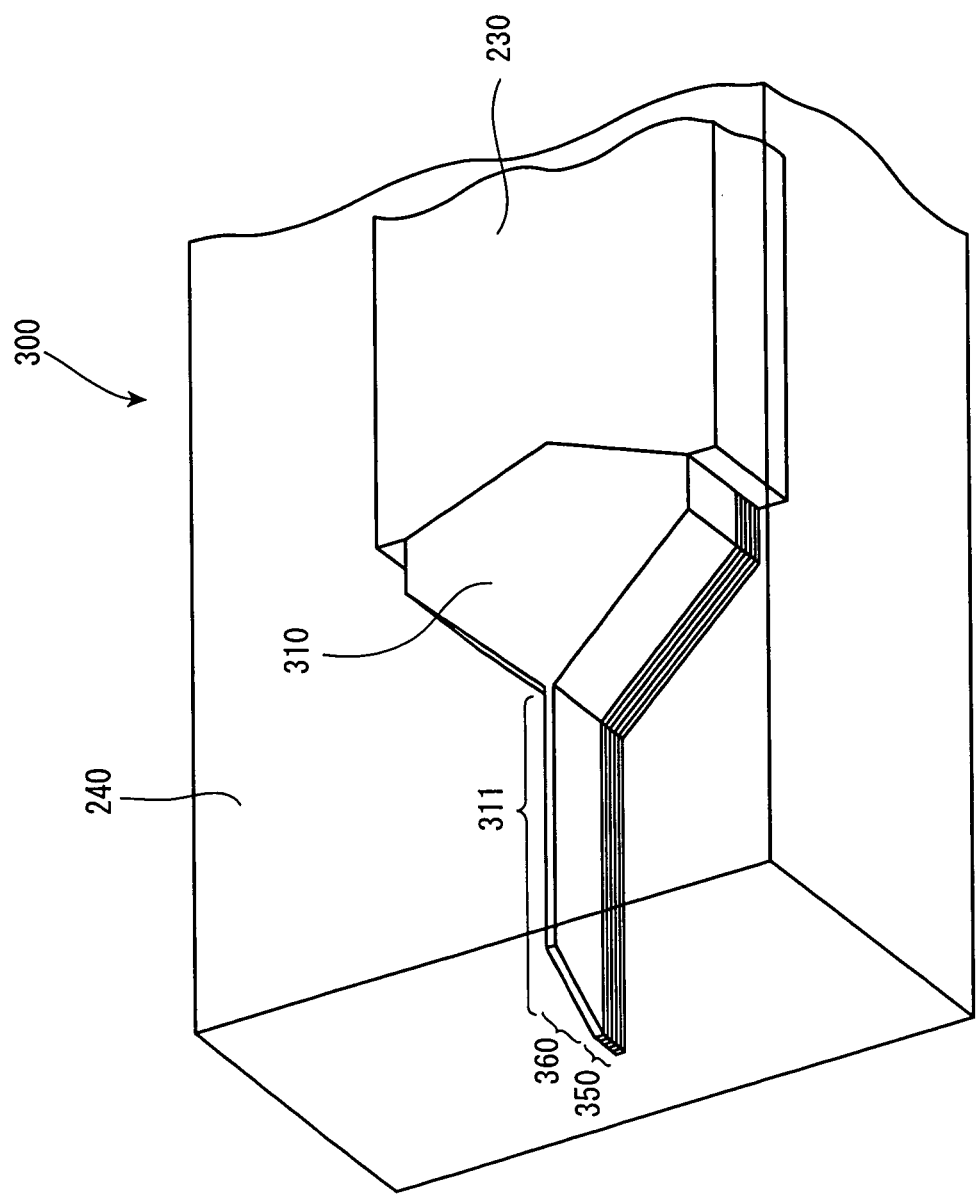
FIG. 14 shows a sixth embodiment of a light emitting head according to the invention.

FIG. 14 shows a sixth embodiment of a light emitting head according to the invention.

Similarly to the light emitting head 200 according to the fifth embodiment, a light emitting head 300 shown in FIG. 14 is provided with a core 230, a clad 240, and a propagating body 310 which has an extended section 311. The propagating body 310 is provided with a first structure section 350 and a second structure section 360, which have similar layered structures to the layered structure of the propagating body according to the fourth embodiment described above.

Figure 15:
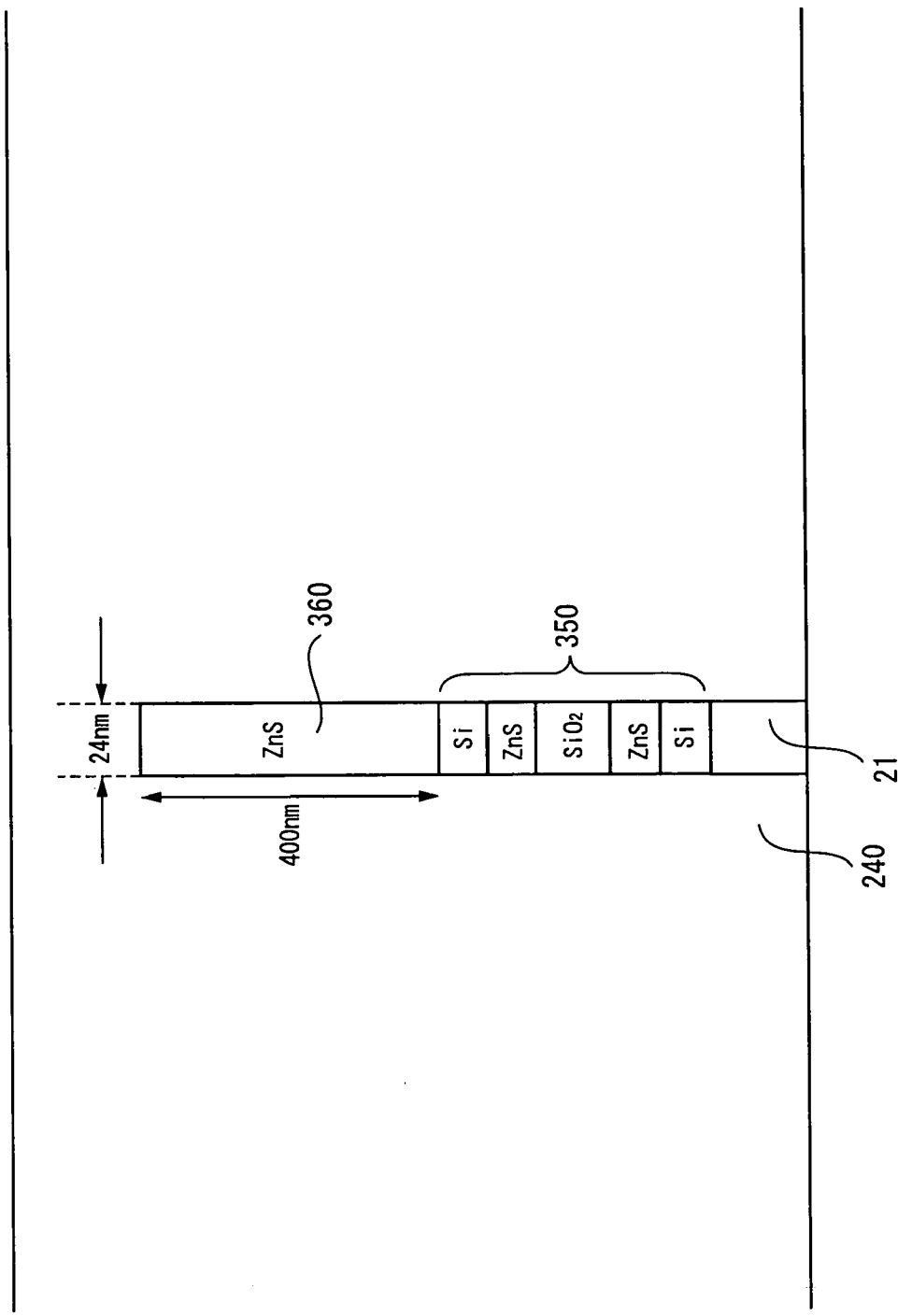
FIG. 15 shows a layered structure in the light emitting head according to the sixth embodiment.

FIG. 15 shows a layered structure in the light emitting head according to the sixth embodiment.

FIG. 15 shows a layered structure viewed from the tip side of the extended section 311 shown in FIG. 14, and the structure has stacked layers each having a width of 24 nm equal to or less than a cut-off size. Similarly to the embodiments described above, a light emitting head according to the sixth embodiment is provided with a first structure section 350 consisting of a first SiO$_2$ layer, a ZnS layer, and a Si layer, as well as a second structure section 360, which is located adjacent to the first structure section 350, consisting of uniform ZnS and having a thickness of 400 nm over a cut-off size. The second structure section 360 is obliquely cut away in the tip area as shown in FIG. 14, and the cut surface reflects and concentrates light onto the first structure section 350.

There is the upper core 21 adjacent to the opposite side to the second structure section 360 with the first structure section 350 therebetween, and the first structure section 350 and the upper core 21 are accurately aligned during application processes.

MgF$_2$, which has a refractive index sufficiently smaller than that of the extended section, is employed as a material for the clad 240, because light must be propagated through the first structure section 350 or second structure section 360, which are formed to have a width of 24 nm.

Figure 16:
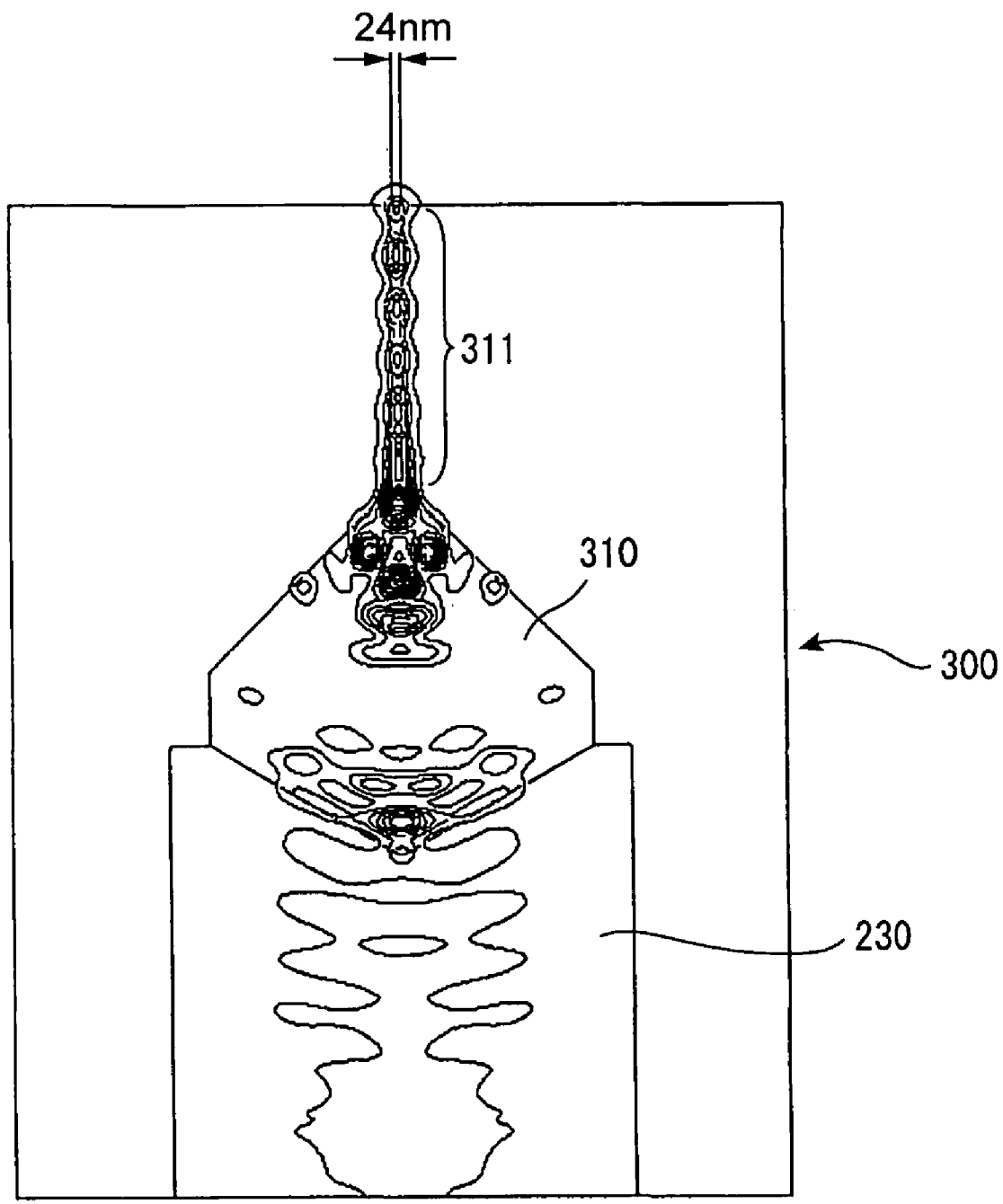
FIG. 16 is a front view illustrating a result of a simulation for an electric field intensity distribution for the light emitting head according to the sixth embodiment.
Figure 17:
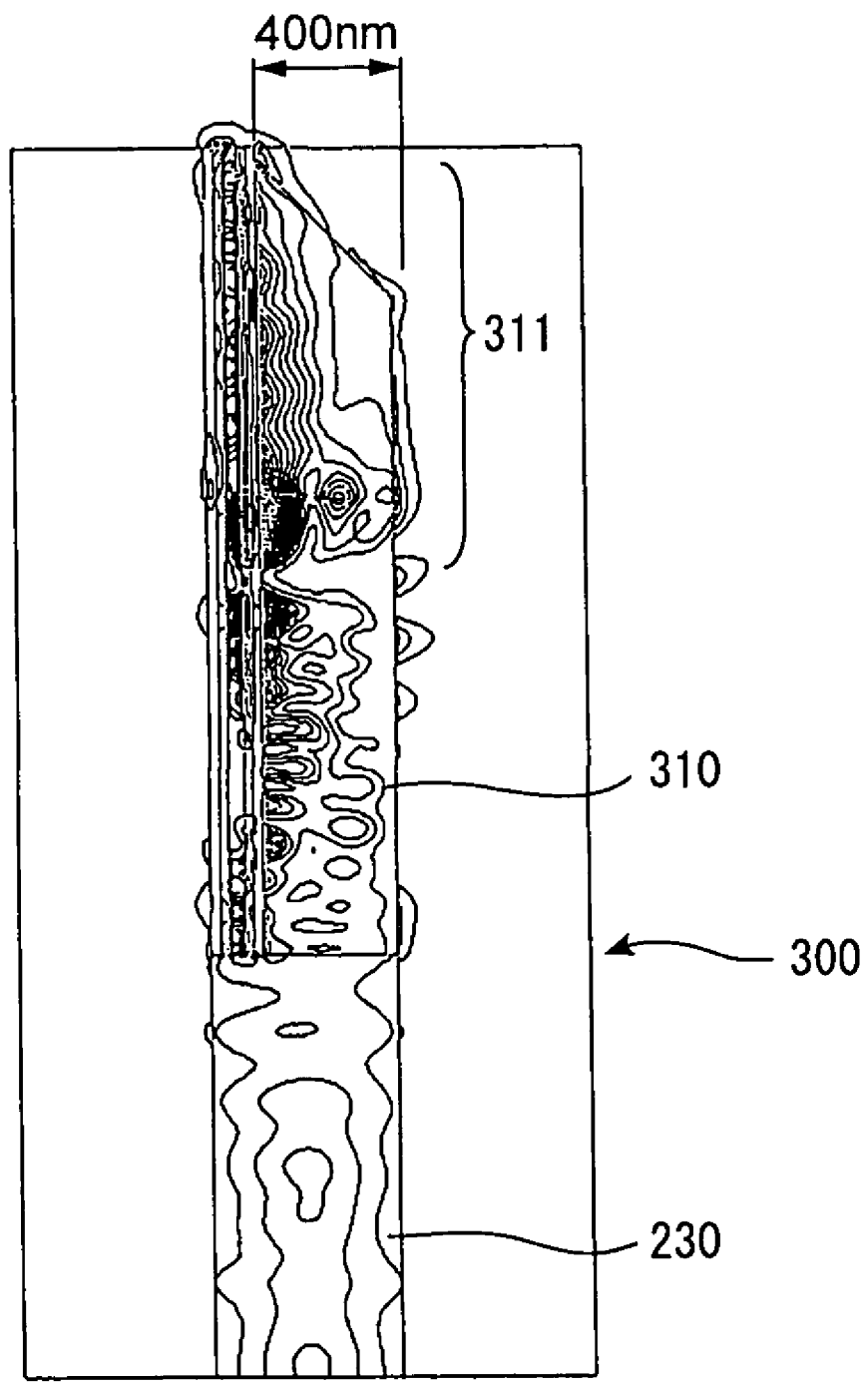
FIG. 17 is a side view illustrating a result of a simulation for an electric field intensity distribution for the light emitting head according to the sixth embodiment.

FIG. 16 is a front view illustrating a result of a simulation for an electromagnetic field intensity distribution for the light emitting head according to the sixth embodiment, and FIG. 17 is a side view illustrating the result.

The light whose λ is 400 nm enters the propagating body 310 from the core 230, and an intense peak of electromagnetic field is formed on the bottom of the extended section 311. The intense electromagnetic field is efficiently propagated through the narrow extended section 311 having a width of 24 nm, and a light spot is formed with a sufficient intensity on the tip of the extended section 311.

Knots of the intensity yielded in the extended section 311 in FIG. 16 are caused by interference between propagating waves toward the tip and those reflected on the tip end, and the intensity distribution only for the propagating waves toward the tip is gradually attenuated within the extended section 311.

In the light emitting head according to the sixth embodiment, the size of the spot in the in-plane direction depends on the width of the extended section 311, and is much smaller than the size of the spot according to the first embodiment.

According to embodiments described above, light is efficiently propagated through the tip of the light emitting head by the first structure section, resulting in high utilization efficiency of light. Because the second structure section is provided on one side of the first structure section to form a light spot in an area biased to the first structure section side on the tip of the light emitting head, there is provided an arrangement in which the light spot is located sufficiently close to the recording magnetic head. Additionally, with embodiments which have an extended section, some allowance is made for a location for creating a light emitting aperture when fabricating it by removing the tip of the light emitting head, providing superior workability.

Finally, a fabrication procedure will now be described for fabricating the light emitting head and other heads as a composite head as described in FIG. 2. Although the described procedure may be applied to light emitting heads of all embodiments described above, it will be described here as applied to a typical light emitting head of the first embodiment.

Figure 18:
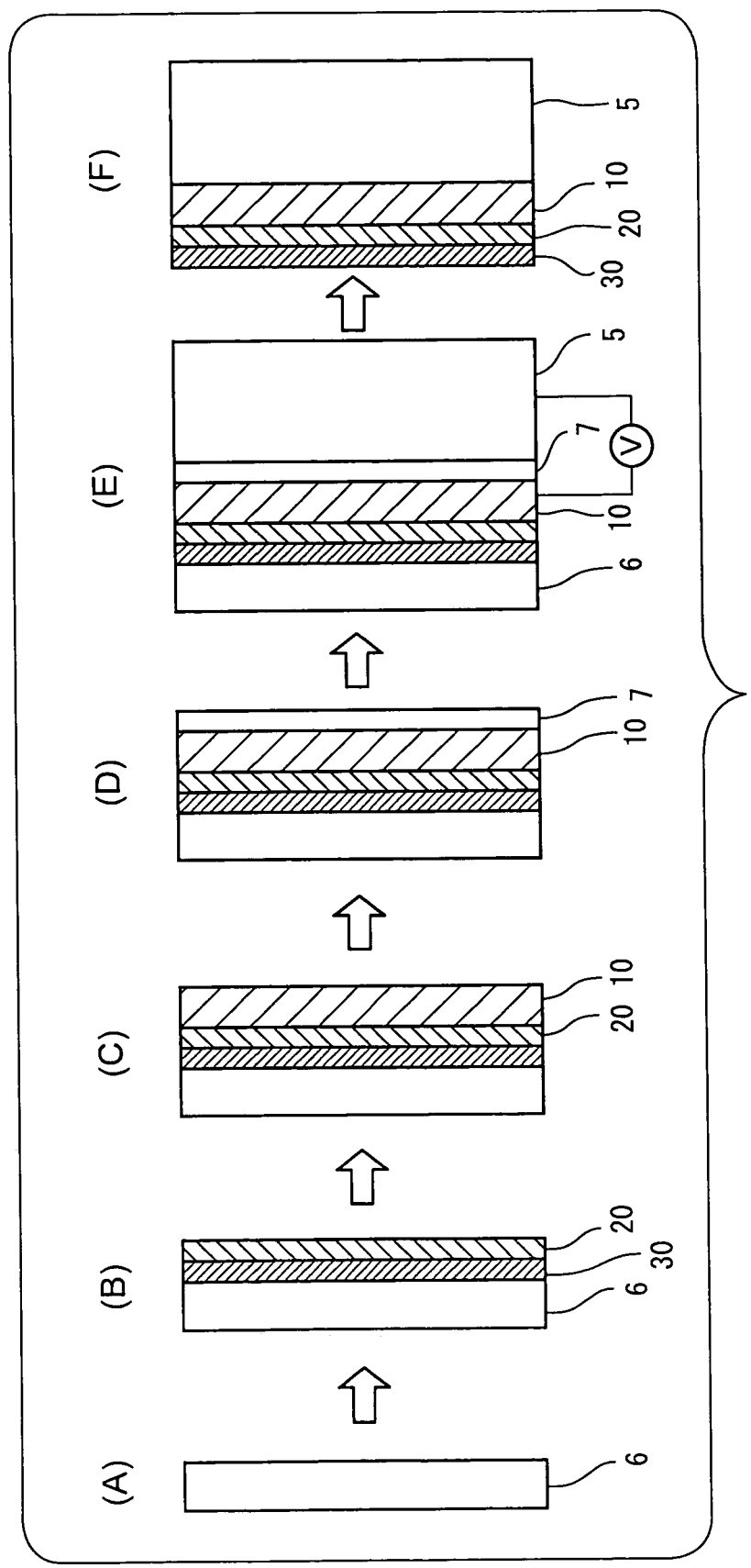
FIG. 18 shows a fabrication procedure for a composite head.

FIG. 18 shows a fabrication procedure for a composite head.

A sacrificial substrate 6 is first provided (step A), and the reproducing sensor head 30 and the recording magnetic head 20 is formed on the sacrificial substrate 6 in this order (step B). The step B represents an example of a magnetic head forming step according to the invention. If a flat surface having sufficient area for forming a light emitting head on the recording magnetic head 20 cannot be provided, the top surface of the recording magnetic head 20 is planarized by forming a film using an Al material or clad and polishing the surface thereof.

The light emitting head 10 is then formed on the recording magnetic head 20 with the upper core and the micro aperture aligned (step C). The step C represents an example of a light emitting head forming step according to the invention.

An SiO$_2$ film is formed on the surface of the light emitting head 10, on which a fusible material 7 (such as Pyrex (R) glass) having good adherence to the light emitting head 10 is applied on the light emitting head 10 (step D). A material, such as Si, to be used as the slider 5 is fitted on the fusible material 7, and high temperature and high voltage are applied between the light emitting head 10 and the slider 5 (step E) to cause the fusible material 7 to join the light emitting head 10 and the slider 5 by an anodic bonding. These step D and E represent examples of a joining step according to the invention.

Finally, the sacrificial substrate 6 is removed by etching and the like to provide a composite head in which the light emitting head 10, the recording magnetic head 20, and the reproducing magnetic sensor head 30 are arranged in the order from the slider 5 side (step F). The step F represents an example of a removing step according to the invention.

A direct bonding or a bonding using a brazing material such as Ag or Au may be applied instead of the anodic bonding described above.

In the above description, although a light assisted magnetic recording/reproducing device is illustrated as one embodiment of an information storage device according to the invention, the information storage device may be a phase-change optical disk device or a magneto-optical disk device.

Furthermore, although a light emitting head according to the invention is suitable for a light emitting head for an information storage device, the invention may be used, for example, to form a small light spot for devices other than the information storage device.

What is claimed is:

1. A light emitting head which receives light from a incident light origin and propagates and focuses the light to an exiting light destination, comprising:
    a first structure section comprising,
    a first well propagating section which consists of a first low extinction material with attenuation of light substantially low to a negligible extent, the first well propagating section being located along an optical axis from the incident light origin to the exiting light destination,
    a second well propagating section which consists of a second low extinction material with attenuation of light substantially low to a negligible extent, and whose refractive index is larger than that of the first well propagating section in a bulk material, a pair of the second well propagating sections sandwiching the first well propagating section therebetween in at least one axis-intersecting direction intersecting the optical axis, and
    a poor propagating section which consists of a material with any propagating characteristics, which may be non-propagative, poorer than that of the second well propagating section in a bulk material, a pair of the poor propagating sections further sandwiching the first and second well propagating sections therebetween from the outside of the second well propagating section in the axis-intersecting direction, and
    a second structure section being located on one of two sides sandwiching the first structure section in the axis-intersecting direction, the second structure section concentrating light on the first structure section within the range from the incident light origin to the exiting light destination.

2. The light emitting head according to claim 1, wherein the second structure section has a reflecting surface inclined with respect to the optical axis and reflects light toward the first structure section.

3. The light emitting head according to claim 1, wherein the second structure section has a sequential or continuous refractive index distribution in which the refractive index increases toward the first structure section.

4. The light emitting head according to claim 1, wherein the second structure section has a layered structure in which a set of multiple kinds of layers varying in refractive index each other extends along the optical axis and the set repeats multiple times in a repeating interval greater than the width of the first structure section in the axis-intersecting direction.

5. The light emitting head according to claim 4, wherein the set includes a first kind of layer with attenuation of light substantially low to a negligible extent, and a second kind of layer with attenuation of light.

6. The light emitting head according to claim 4, wherein the second structure section is arranged such that the thickness ratio of multiple kinds of layers constituting a set is equal to each other, and total thickness of layers of each set varies each other.

7. A light emitting head, comprising:
a propagating body which propagates light, the propagating body having a tapered two dimensional shape symmetrical with respect to a predetermined axis of symmetry; and
a covering body which covers the propagating body so that the axis of symmetry is surrounded, the covering body confining light within the propagating body, the light emitting head which irradiates light propagating through the propagating body from a tip of the propagating body;
wherein the propagating body has a two dimensional shape having a bottom edge intersecting the axis of symmetry, a pair of reflecting edges which sandwich the axis of symmetry and narrow the distance therebetween as receding from the bottom edge side, and a pair of extending edges extending along the axis of symmetry from the narrower end of the pair of reflecting edges.

8. The light emitting head according to claim 7, wherein the propagating body has a layered structure consisting of multiple layers having the two dimensional shape, and wherein the light emitting head comprises:
a first structure section having,
a first well propagating layer which consists of a first low extinction material with attenuation of light substantially low to a negligible extent,
a second well propagating layer which consists of a second low extinction material with attenuation of light substantially low to a negligible extent, and whose refractive index is larger than that of the first well propagating layer, a pair of the second well propagating layers sandwiching the first well propagating layer therebetween, and
a poor propagating layer which consists of a material with any propagating characteristics, which may be non-propagative, poorer than that of the second well propagating layer, a pair of the poor propagating layers further sandwiching the first and second well propagating layers therebetween from the outside of the second well propagating layer, and
a second structure section being located on one of two sides of the first structure section, the second structure section concentrating propagated light on the first structure section.

9. The light emitting head according to claim 7, wherein the covering body has a refractive index lower than that of the propagating body, or a negative relative dielectric constant.

10. The light emitting head according to claim 7, wherein, in the propagating body, a spacing d between the extending edges is expressed as $d \leq \lambda/2n$ with respect to a refractive index n of the propagating body and a wavelength $\lambda$ of light, and
the covering body has a refractive index lower than that of the propagating body by 1.0 or more at least in an area of the propagating body bounded by the extending edges.

11. An information storage device which irradiates light onto a predetermined information storage medium, and uses the irradiated light for at least one of information reproduction and information recording, comprising:
a light emitting head comprising,
a first structure section comprising,
a first well propagating section which consists of a first low extinction material with an imaginary part of a complex index of refraction substantially low to a negligible extent, the first well propagating section being located along an optical axis from an incident light origin to an exiting light destination,
a second well propagating section which consists of a second low extinction material with an imaginary part of a complex index of refraction substantially low to a negligible extent, and whose real part of a complex index of refraction is larger than that of the first well propagating section, a pair of the second well propagating sections sandwiching the first well propagating section therebetween in at least one axis-intersecting direction intersecting the optical axis, and
a poor propagating section which consists of a material with any propagating characteristics, which may be non-propagative, poorer than that of the second well propagating section, a pair of the poor propagating sections further sandwiching the first and second well propagating sections therebetween from the outside of the second well propagating section in the axis-intersecting direction, and
a second structure section being located on one of two sides sandwiching the first structure section in the axis-intersecting direction, the second structure section concentrating light on the first structure section;
a light source which emits light; and
a light introducing section which causes light emanated from the light source to enter into the light emitting head from the incident light origin for the light emitting head.

12. The information storage device according to claim 11, comprising a magnetic head adjacent to the side on the light emitting head opposite to the second structure section with the first structure section in-between.

13. An information storage device which irradiates light onto a predetermined information storage medium, and uses the irradiated light for at least one of information reproduction and information recording, comprising:
a light emitting head comprising a propagating body which propagates light, the propagating body having a tapered two dimensional shape symmetrical with respect to a predetermined axis of symmetry, and a covering body which covers the propagating body so that the axis of symmetry is surrounded, the covering body confining light within the propagating body, the light emitting head which irradiates light propagating through the propagating body from a tip of the propagating body;
a light source which emits light; and
a light introducing section which causes light emanated from the light source to enter into the light emitting head from the incident light origin for the light emitting head;
wherein the propagating body of the light emitting head has a two dimensional shape having a bottom edge intersecting the axis of symmetry, a pair of reflecting edges which sandwich the axis of symmetry and narrow the distance therebetween as receding from the bottom edge side, and a pair of extending edges extending along the axis of symmetry from the narrower end of the pair of reflecting edges.

14. A method for manufacturing a composite head mounted on a slider, the composite head having a recording light emitting head, a recording magnetic head, and a reproducing magnetic head, the method comprising the steps of:

forming a magnetic head forming in which the reproducing magnetic head and the recording magnetic head are formed in this order in a stacked manner on a sacrificial substrate;

forming a light emitting head in which the recording light emitting head is formed on the recording magnetic head;

joining the recording light emitting head to a slider body; and removing the sacrificial substrate.

* * * * *